US010597787B2

(12) United States Patent
Ono et al.

(10) Patent No.: US 10,597,787 B2
(45) Date of Patent: Mar. 24, 2020

(54) ELECTROCHEMICAL REACTION DEVICE

(71) Applicant: Kabushiki Kaisha Toshiba, Minato-ku (JP)

(72) Inventors: Akihiko Ono, Kita (JP); Satoshi Mikoshiba, Yamato (JP); Yuki Kudo, Yokohama (JP); Ryota Kitagawa, Setagaya (JP); Jun Tamura, Yokohama (JP); Eishi Tsutsumi, Kawasaki (JP); Yoshitsune Sugano, Kawasaki (JP); Masakazu Yamagiwa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 483 days.

(21) Appl. No.: 15/260,982

(22) Filed: Sep. 9, 2016

(65) Prior Publication Data
US 2016/0376713 A1 Dec. 29, 2016

Related U.S. Application Data

(63) Continuation of application No. PCT/JP2015/002527, filed on May 20, 2015.

(30) Foreign Application Priority Data

May 20, 2014 (JP) .................................. 2014-104621
Oct. 23, 2014 (JP) .................................. 2014-216315

(51) Int. Cl.
C25B 1/00 (2006.01)
C25B 1/04 (2006.01)
(Continued)

(52) U.S. Cl.
CPC ............... *C25B 1/003* (2013.01); *C25B 1/04* (2013.01); *C25B 3/04* (2013.01); *C25B 11/03* (2013.01);
(Continued)

(58) Field of Classification Search
CPC .. C25B 1/003; C25B 1/04; C25B 3/04; C25B 11/03; C25B 11/035; Y02P 20/135;
(Continued)

(56) References Cited

U.S. PATENT DOCUMENTS 4,160,816 A   7/1979  Williams et al.
9,528,192 B1* 12/2016  Chen .......................... C25B 9/18
(Continued)

FOREIGN PATENT DOCUMENTS

DE    10 2012 205 258 A1   10/2013
GB    2 414 243 A           11/2005
(Continued)

OTHER PUBLICATIONS

Wenlei Zhu et al. "Monodisperse Au Nanoparticles for Selective Electrocatalytic Reduction of Co2 to CO", Journal of the American Chemical Society, 2013, 4 pages.
(Continued)

*Primary Examiner* — Ciel P Thomas
(74) *Attorney, Agent, or Firm* — Oblon, McClelland, Maier & Neustadt, L.L.P.

(57) ABSTRACT

An electrochemical reaction device includes: an electrolytic solution tank to store an electrolytic solution; an oxidation electrode disposed in the electrolytic solution tank; a reduction electrode disposed in the electrolytic solution tank; and a generator connected to the oxidation electrode and the reduction electrode. At least one of the oxidation electrode or the reduction electrode has a porous structure containing fine pores.

10 Claims, 17 Drawing Sheets

(51) Int. Cl.
*C25B 3/04* (2006.01)
*C25B 11/03* (2006.01)
*H01L 31/056* (2014.01)
*H01L 31/078* (2012.01)
*B01J 35/00* (2006.01)
*H01G 9/20* (2006.01)

(52) U.S. Cl.
CPC .......... *C25B 11/035* (2013.01); *H01L 31/056* (2014.12); *H01L 31/078* (2013.01); *B01J 35/0033* (2013.01); *H01G 9/2013* (2013.01); *Y02E 10/52* (2013.01); *Y02E 60/366* (2013.01); *Y02E 70/10* (2013.01); *Y02P 20/135* (2015.11)

(58) Field of Classification Search
CPC ............... B01J 35/0033; H01G 9/2013; H01L 31/02021; Y02E 60/366; Y02E 70/10
See application file for complete search history.

(56) References Cited

U.S. PATENT DOCUMENTS

| | | | |
|---|---|---|---|
| 2005/0109394 A1* | 5/2005 | Anderson | C25B 1/04 136/244 |
| 2009/0000574 A1 | 1/2009 | Sugimasa et al. | |
| 2010/0133111 A1* | 6/2010 | Nocera | C25B 1/003 205/633 |
| 2011/0114502 A1 | 5/2011 | Cole et al. | |
| 2012/0222967 A1* | 9/2012 | Oakes | C25B 1/003 205/637 |
| 2012/0292187 A1* | 11/2012 | Kim | B01D 61/44 204/527 |
| 2013/0015076 A1 | 1/2013 | Yoshida et al. | |
| 2013/0075250 A1* | 3/2013 | Tokuhiro | C01B 3/042 204/252 |
| 2013/0168228 A1* | 7/2013 | Ozin | B01J 35/004 204/157.9 |
| 2013/0269761 A1 | 10/2013 | Ardo et al. | |
| 2015/0068915 A1 | 3/2015 | Hoch et al. | |
| 2015/0259810 A1* | 9/2015 | Lewis | C25B 11/0447 204/291 |

FOREIGN PATENT DOCUMENTS

| | | |
|---|---|---|
| JP | 61-67790 | 4/1986 |
| JP | 61-22036 | 5/1986 |
| JP | 10-290017 | 10/1998 |
| JP | 2005-329376 | 12/2005 |
| JP | 2006-265697 | 10/2006 |
| JP | 2010-138039 | 6/2010 |
| JP | 2011-94194 | 5/2011 |
| JP | 2011-184767 | 9/2011 |
| JP | 2012-112023 | 6/2012 |
| JP | 2012-177160 | 9/2012 |
| JP | 2013-536319 | 9/2013 |
| WO | WO 2012/070296 A1 | 5/2012 |
| WO | WO 2012/114787 A1 | 8/2012 |

OTHER PUBLICATIONS

Yihong Chen et al. "Aqueous Co2 Reduction at very Low Overpotential on Oxide-Derived Au Nanoparticles", Journal of the American Chemical Society, 2012, 4 pages.
International Search report dated Aug. 4, 2015 in PCT/JP2015/002527, filed on May 20, 2015 ( with English Translation).
Written Opinion dated Aug. 4, 2015 in PCT/JP2015/002527, filed on May 20, 2015.
Office Action dated Sep. 17, 2018 in European Patent Application No. 15795869.5.
Ogura K. et al; "Electrocatalytic reduction of carbon dioxide to methanol-VI. Use of a solar cell and comparison with that of carbon monoxide", Electrochimica Acta, Elsevier Science Publishers, Barking, GB, vol. 32, No. 8, Aug. 1, 1987, pp. 1191-1195.
Satoshi Yotsuhashi, et al., "$CO_2$ Conversion with Light and Water by GaN Photoelectrode," Japanese Journal of Applied Physics, vol. 51, (2012), pp. 02BP07-1 to 025P07-3.
Steven Y. Reece, et al., "Wireless Solar Water Splitting Using Silicon-Based Semiconductors and Earth-Abundant Catalysts," Science, vol. 334, Nov. 4, 2011, pp. 645-648 plus end page.
Extended European Search Report dated Oct. 10, 2017 in European Patent Application No. 15795869.5.
T. Jasper Jacobsson, et al., "Sustainable solar hydrogen production: from photoelectrochemical cells to PV-electrolyzers and back again", Energy & Environmental Science, vol. 7 No. 7. XP055411230. Apr. 11, 2014, pp. 2056-2070.
Daniel G. Nocera, "The Artificial Leaf", Accounts of Chemical Research, vol. 45 No. 5, XP055119193, Apr. 4, 2012, pp. 767-776.

* cited by examiner

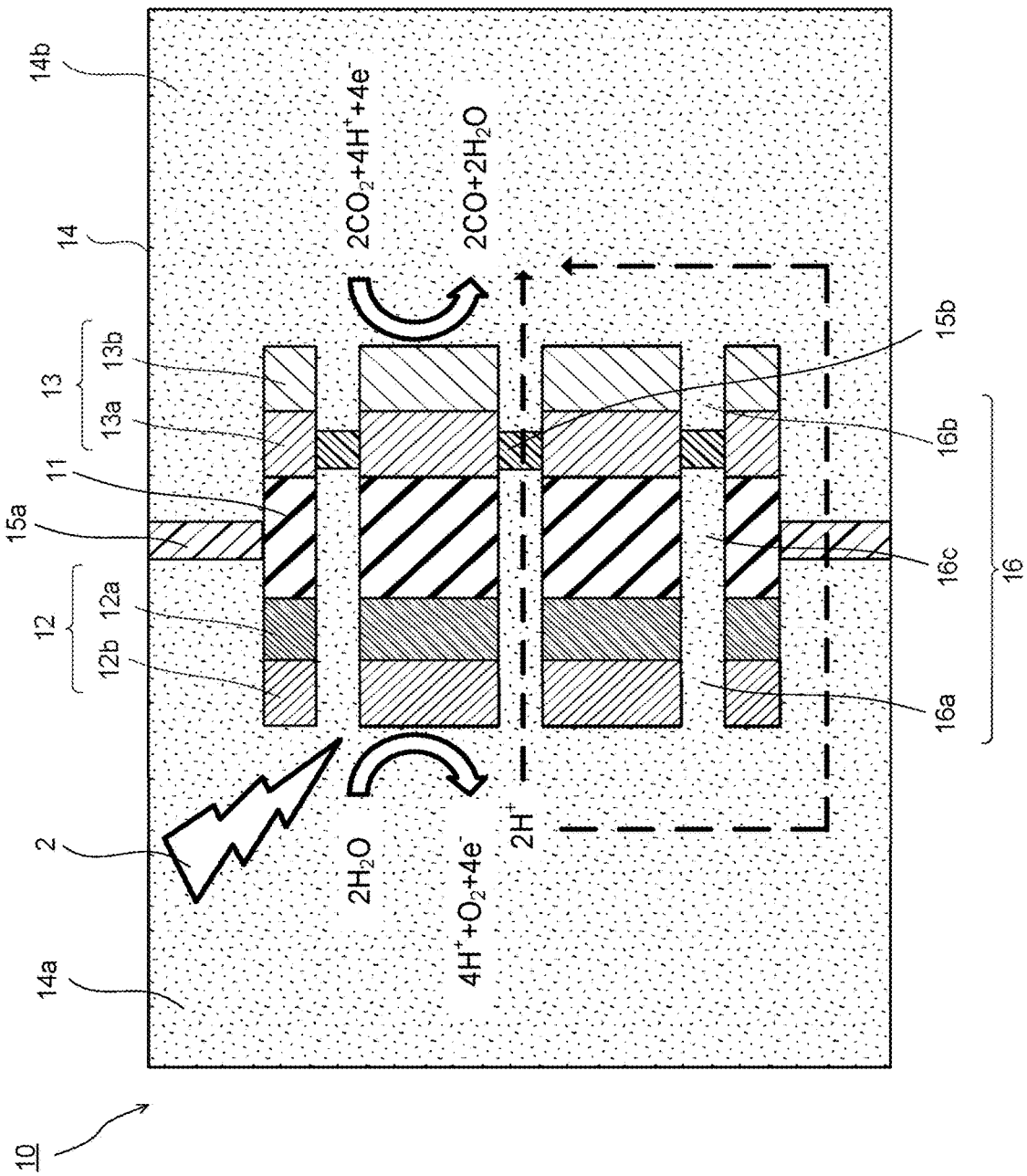

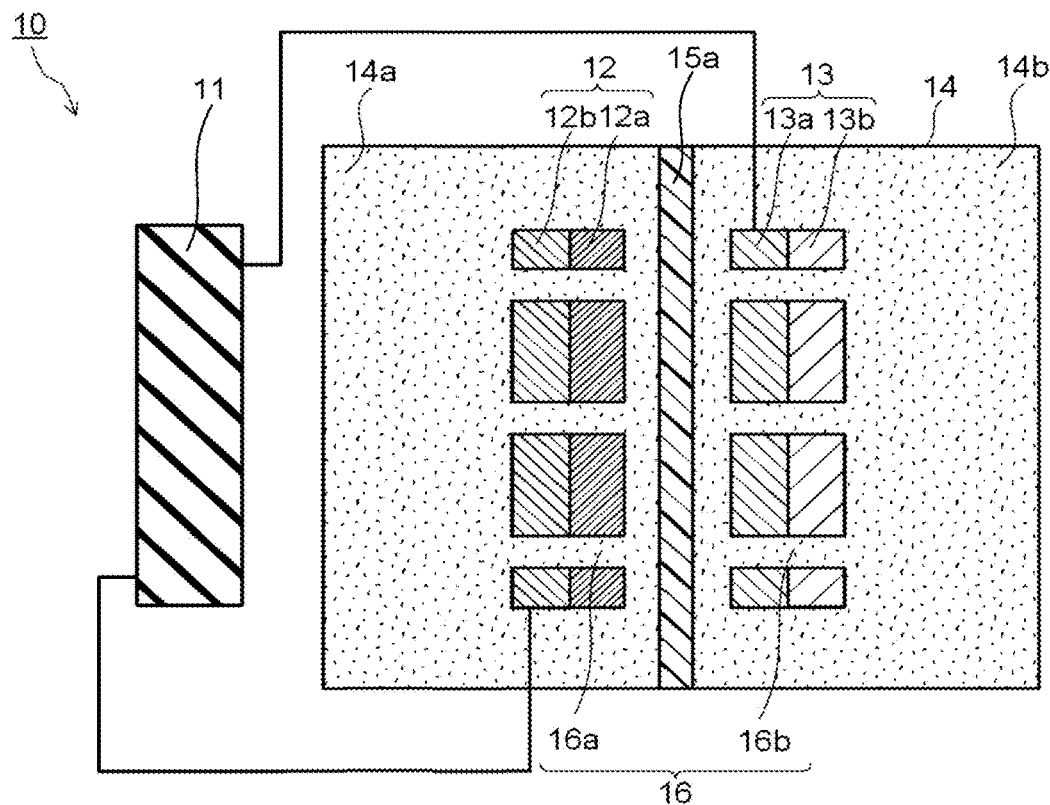
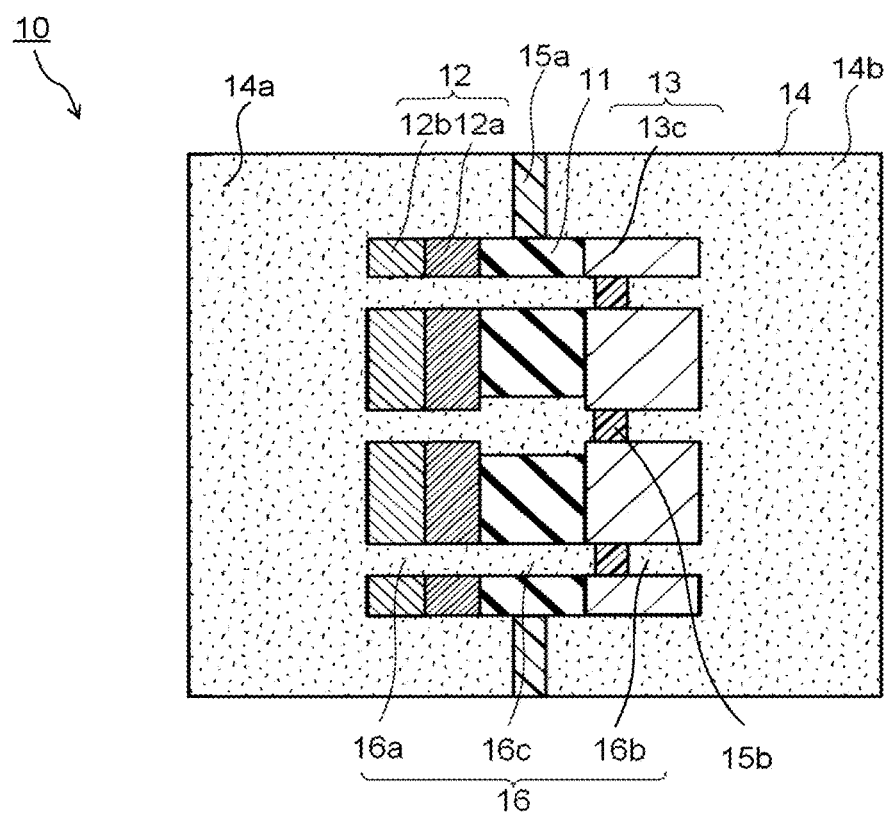

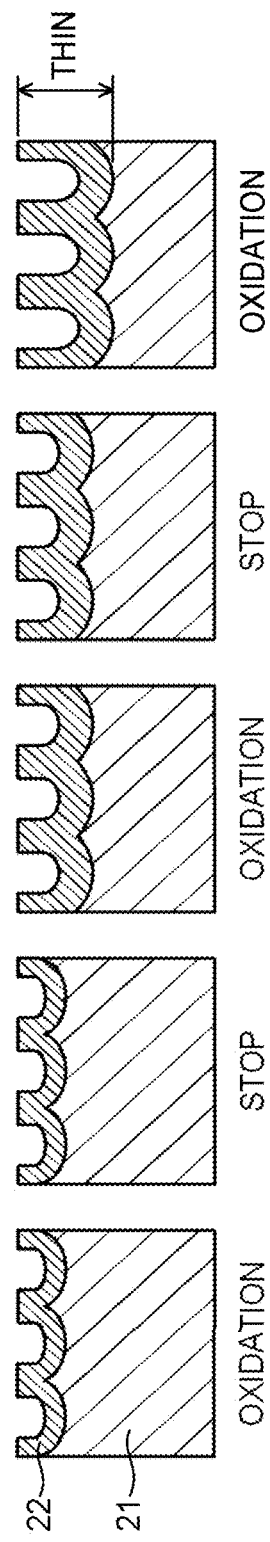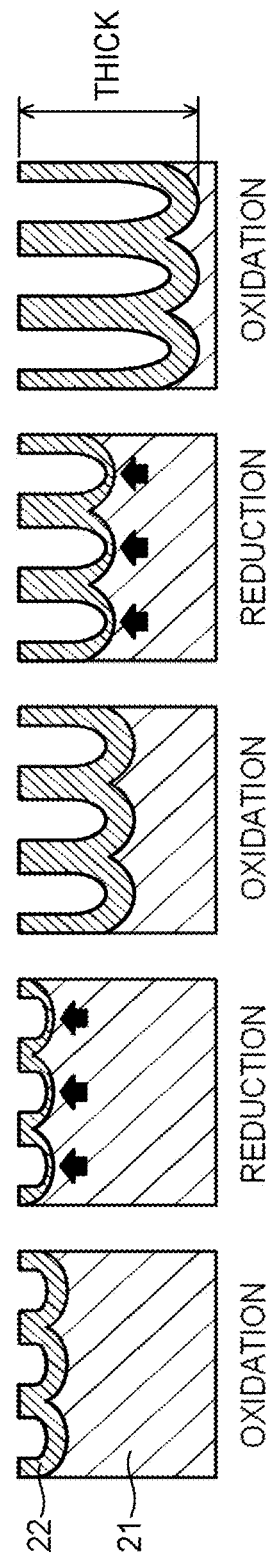

ELECTROCHEMICAL REACTION DEVICE

CROSS-REFERENCE TO RELATED APPLICATIONS

This application is a continuation of prior International Application No. PCT/JP2015/002527 filed on May 20, 2015, which is based upon and claims the benefit of priority from Japanese Patent Applications Nos. 2014-104621 filed on May 20, 2014 and 2014-216315 filed on Oct. 23, 2014; the entire contents of all of which are incorporated herein by reference.

FIELD

Embodiments described herein relate generally to an electrochemical reaction device.

BACKGROUND

The development of artificial photosynthesis technology that replicates photosynthesis of plants to electrochemically convert sunlight to a chemical substance has been recently progressing in consideration of an energy problem and an environmental problem. Converting sunlight to a chemical substance to store it in a cylinder or a tank is advantageous in that it costs lower for energy storage and has a less storage loss than converting sunlight to electricity to store it in a battery.

A known electrochemical reaction device that electrochemically converts sunlight to a chemical substance is, for example, a two-electrode device including an electrode having a reduction catalyst for reducing carbon dioxide ($CO_2$) and an electrode having an oxidation catalyst for oxidizing water ($H_2O$), the electrodes being immersed in water containing dissolved carbon dioxide. In this case, these electrodes are connected to each other via an electric wire or the like. The electrode having the oxidation catalyst oxidizes $H_2O$ using light energy to produce oxygen ($1/2O_2$) and obtain a potential. The electrode having the reduction catalyst obtains the potential from the electrode that causes the oxidation reaction, thereby reducing carbon dioxide to produce formic acid (HCOOH) or the like. In the two-electrode type device, since the reduction potential of $CO_2$ is obtained by two-stage excitation, conversion efficiency from the sunlight to chemical energy is very low, namely, about 0.04%. Another known electrochemical reaction device that performs a photoelectric conversion using GaN, oxidizes water at a surface thereof and reduces $CO_2$ by a copper plate which is connected thereto. However, conversion efficiency is low, namely, 0.2%.

An electrochemical reaction device using a stack (silicon solar cell or the like) where a photovoltaic body is sandwiched between a pair of electrodes is also under consideration. In the electrode on a light irradiation side, water ($2H_2O$) is oxidized by light energy, whereby oxygen ($O_2$) and hydrogen ions ($4H^+$) are obtained. In the opposite electrode, by using the hydrogen ions ($4H^+$) produced in the electrode on the light irradiation side and potential (e) generated in the photovoltaic body, hydrogen ($2H_2$) or the like is obtained as the chemical substance. There is also known an electrochemical reaction device where the silicon solar cells are stacked. The conversion efficiency from the sunlight to the chemical energy in this case is high, but it is inconvenient to store and transport hydrogen. In consideration of energy problems and environmental problems, it is preferable to convert into not hydrogen but carbon compounds which are easy to be stored and transported.

BRIEF DESCRIPTION OF THE DRAWINGS

FIG. 3 is a schematic view illustrating an operation example of the electrochemical reaction device.

FIG. 4 is a schematic view illustrating another structure example of the electrochemical reaction device.

FIG. 5 is a schematic view illustrating another structure example of the electrochemical reaction device.

FIG. 17 is a schematic view illustrating a mechanism when a nanoparticle structure is formed by using a high-frequency potential.

FIG. 18 is a schematic view illustrating a mechanism when the nanoparticle structure is formed by using the high-frequency potential.

DETAILED DESCRIPTION

An electrochemical reaction device according to an embodiment includes: an electrolytic solution tank to store an electrolytic solution; an oxidation electrode disposed in the electrolytic solution tank; a reduction electrode disposed in the electrolytic solution tank; and a generator connected to the oxidation electrode and the reduction electrode. At least one of the oxidation electrode or the reduction electrode has a porous structure including fine pores.

Figure 1:
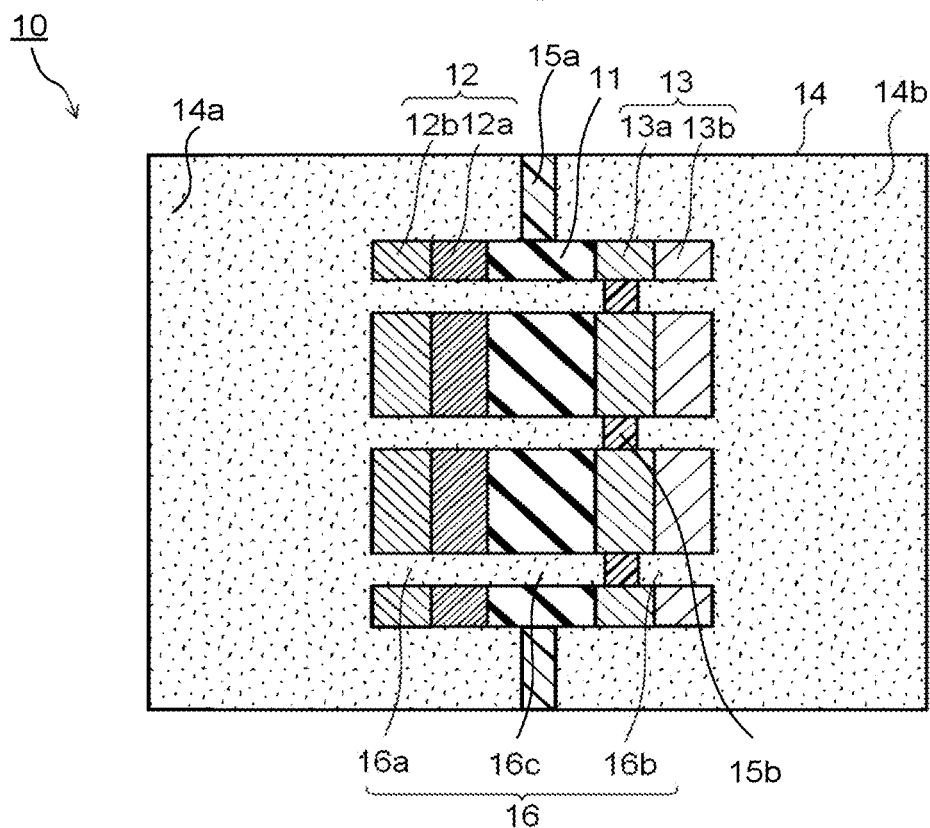
FIG. 1 is a schematic view illustrating a structure example of an electrochemical reaction device.

FIG. 1 is a schematic view illustrating a structure example of an electrochemical reaction device. An electrochemical reaction device 10 illustrated in FIG. 1 includes a photovoltaic body 11, an oxidation electrode 12, a reduction electrode 13, an electrolytic solution 14, an ion exchange membrane 15a, and an ion exchange membrane 15b. Further, the electrochemical reaction device 10 includes a through hole 16. The through hole 16 includes a through hole 16a penetrating the oxidation electrode 12, a through hole 16b penetrating the reduction electrode layer 13, and a through hole 16c penetrating the photovoltaic body 11. As illustrated in FIG. 1, the through hole 16a to the through hole 16c are provided to be communicated with each other. Diameters of the through hole 16a to the through hole 16c may be different from one another. The through hole 16a to the through hole 16c do not have to be provided. Further, the through hole 16a to the through hole 16c may not be communicated with each other.

The photovoltaic body 11 has a function of performing charge separation by energy of irradiated light such as sunlight or the like. Holes generated by the charge separation move to the oxidation electrode 12 side and electrons move to the reduction electrode 13 side. This allows the photovoltaic body 11 to generate electromotive force. The photovoltaic body 11 has a first face and a second face facing each other. Examples of the photovoltaic body 11 include a photoelectric conversion body in a pn-junction type or a pin junction type. The photovoltaic body 11 may be formed by stacking a plurality of photoelectric conversion layers. A generator is not limited to the photoelectric conversion element having the photoelectric conversion body. Examples of the generator include a system power supply, a storage battery, or the renewable energy such as the wind power, water power, and the geothermal power.

The through hole 16c of the photovoltaic body 11 is formed by removing a part of the photovoltaic body 11 by, for example, etching or the like. The through hole 16c may be formed by a plurality of opening processes.

Figure 2:
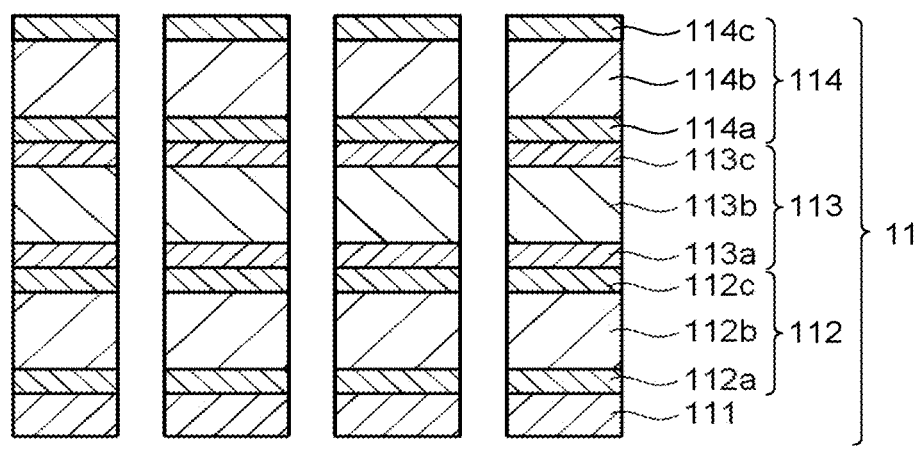
FIG. 2 is a schematic view illustrating a structure example of a photovoltaic body.

FIG. 2 is a schematic view illustrating a structure example of the photovoltaic body 11. The photovoltaic body 11 illustrated in FIG. 2 includes a reflector 111, a photoelectric conversion layer 112, a photoelectric conversion layer 113, and a photoelectric conversion layer 114. The reflector 111 does not have to be provided.

The reflector 111 is made up of a material having light reflectivity. As the reflector 111, there can be cited, for example, a distributed Bragg reflector made up of a stack of metal layers or semiconductor layers. Provision of the reflector 111 makes it possible to reflect light, which has not been absorbed by the photoelectric conversion layer 112 to the photoelectric conversion layer 114, so as to make the light incident on any of the photoelectric conversion layer 112 to the photoelectric conversion layer 114, thereby increasing the conversion efficiency from light to chemical substances.

Examples of the reflector 111 include a layer of a metal such as Ag, Au, Al, Cu, or an alloy containing at least one of these metals, and so on. The reflector 111 may be a stack of a first reflector and a second reflector. In this case, the first reflector has light reflectivity and electrical conductivity, and the second reflector has a light transmitting property.

Examples of the first reflector include the above-described metal material or alloy. The second reflector is provided for enhancing the light reflectivity by adjusting an optical distance. The second reflector is preferably formed of a material having the light transmitting property and capable of coming into ohmic contact with an n-type semiconductor layer. Examples of the second reflector include a layer of a light transmissive metal oxide such as indium tin oxide (ITO), zinc oxide (ZnO), fluorine-doped tin oxide (FTO), aluminum-doped zinc oxide (AZO), or antimony-doped tin oxide (ATO).

The photoelectric conversion layer 112 is provided on the reflector 111. The photoelectric conversion layer 112 includes an n-type semiconductor layer 112a made up of n-type amorphous silicon (a-Si), an i-type semiconductor layer 112b made up of intrinsic amorphous silicon germanium (a-SiGe), and a p-type semiconductor layer 112c made up of p-type microcrystalline silicon (μc-Si) which are stacked in order from a lower side. The i-type semiconductor layer 112b is a layer that absorbs light in a short wavelength region of approximately 400 nm. Accordingly, in the photoelectric conversion layer 112, charge separation is caused by light energy in the short wavelength region.

The photoelectric conversion layer 113 is provided on the photoelectric conversion layer 112. The photoelectric conversion layer 113 includes an n-type semiconductor layer 113a made up of n-type a-Si, an i-type semiconductor layer 113b made up of intrinsic a-SiGe, and a p-type semiconductor layer 113c made up of p-type uc-Si which are stacked in order from the lower side. The i-type semiconductor layer 113b is a layer that absorbs light in an intermediate wavelength region of approximately 600 nm. Accordingly, in the photoelectric conversion layer 113, charge separation is caused by light energy in the intermediate wavelength region.

The photoelectric conversion layer 114 is provided on the photoelectric conversion layer 113. The photoelectric conversion layer 114 includes an n-type semiconductor layer 114a made up of n-type a-Si, an i-type semiconductor layer 114b made up of intrinsic a-Si, and a p-type semiconductor layer 114c made up of p-type uc-Si which are stacked in order from the lower side. The i-type semiconductor layer 114b is a layer that absorbs light in a long wavelength region of approximately 700 nm. Accordingly, in the photoelectric conversion layer 114, charge separation is caused by light energy in the long wavelength region.

The p-type semiconductor layer or the n-type semiconductor layer can be formed by, for example, adding an element which becomes a donor or an acceptor to a semiconductor material. In the photovoltaic body 11 illustrated in FIG. 2, a semiconductor layer containing silicon, germanium and so on is used as the semiconductor layer, though not limited thereto, for example, a compound semiconductor layer or the like can be used. Examples of the compound semiconductor layer include a semiconductor layer containing GaAs, GaInP, AlGaInP, CdTe, CuInGaSe, and so on. Further, a semiconductor layer such as $TiO_2$ or $WO_3$ may be used as long as it is possible to perform photoelectric conversion. Further, each semiconductor layer may be monocrystalline, polycrystalline, or amorphous. Further, the photoelectric conversion layer may be provided with a zinc oxide layer.

In the photovoltaic body 11 illustrated in FIG. 2, an upper surface of the p-type semiconductor layer 114c is the first face and a lower surface of the reflector 111 which is in contact with the n-type semiconductor layer 112a is the second face. As described above, the photovoltaic body 11 illustrated in FIG. 2 is made by stacking the photoelectric conversion layer 112 to the photoelectric conversion layer 114, and thereby can absorb the wide wavelength light of the sunlight and efficiently utilize the energy of the sunlight. In this event, the photoelectric conversion layers are connected in series and therefore can obtain high voltage. A plurality of photoelectric conversion layers may be connected in parallel. Further, a dual junction-type or a single layer-type photovoltaic body may be used. An example of the photovoltaic body having a stack of three photoelectric conversion layers has been explained in FIG. 2, though not limited thereto, the photovoltaic body may have a stack of two or four or more of photoelectric conversion bodies. Further, in place of the stack of the plurality of photoelectric conversion layers, one photoelectric conversion layer may be used. The foregoing is explanation of a structure example of the photovoltaic body 11 illustrated in FIG. 2.

The oxidation electrode 12 illustrated in FIG. 1 is connected to the first face of the photovoltaic body 11. The oxidation electrode 12 has a function of causing an oxidation reaction of water to produce hydrogen ions. The oxidation electrode 12 contains a conductive material and an oxidation catalyst. For example, the oxidation electrode 12 has a conductive layer 12a containing the conductive material, and an oxidation catalyst layer 12b containing the oxidation catalyst stacked on the conductive layer 12a. The oxidation catalyst layer 12b may be, for example, in a thin-film shape, a lattice shape, a granular shape, or a wire shape. The oxidation electrode 12 may be made up of a single layer containing the oxidation catalyst and the conductive material.

The oxidation electrode 12 is made up of, for example, the conductive material capable of coming into ohmic contact with the p-type semiconductor layer 114c in the photovoltaic body 11. Examples of the conductive material include materials containing at least one of Ag, Au, Al, and Cu. The light transmissive metal oxide such as ITO, ZnO, FTO, AZO, or ATO may be used as the conductive material. The oxidation electrode 12 may be, for example, a stack of the metal and the light transmissive metal oxide, a layer containing the metal and another conductive material, or a layer containing the light transmissive metal oxide and another conductive material.

When light is irradiated on the photovoltaic body 11 through the oxidation electrode 12, the oxidation electrode 12 needs to have the light transmitting property. In this case, light transmittance of the oxidation electrode 12 is preferably, for example, at least 10% or more of an irradiation amount of the light irradiated on the oxidation electrode 12, and more preferably 30% or more thereof.

Examples of the oxidation catalyst include a material that decreases activation energy for oxidizing water, in other words, a material that lowers overpotential when producing oxygen and the hydrogen ions by the oxidation reaction of water. Examples of the oxidation catalyst include iridium, platinum, cobalt, manganese catalysts and so on. Further, examples of the oxidation catalyst include binary metal oxide, ternary metal oxide, quaternary metal oxide, and the like. Examples of the binary metal oxide include manganese oxide (Mn—O), iridium oxide (Ir—O), nickel oxide (Ni—O), cobalt oxide (Co—O), iron oxide (Fe—O), tin oxide (Sn—O), indium oxide (In—O), ruthenium oxide (Ru—O) and so on. Examples of the ternary metal oxide include Ni—Co—O, La—Co—O, Ni—La—O, Sr—Fe—O and so on. Examples of the quaternary metal oxide include Pb—Ru—Ir—O, La—Sr—Co—O and so on. A metal complex such as an Ru complex or an Fe complex can be used as the oxidation catalyst. Further, a plurality of materials may be mixed.

The through hole 16a of the oxidation electrode 12 may be formed, for example, at the oxidation electrode 12 in advance. For example, the through hole 16a is formed by removing a part of the oxidation electrode 12 by etching or the like. The through hole 16a may be formed by the plurality of opening processes.

The reduction electrode 13 is connected to the second face of the photovoltaic body 11. The reduction electrode 13 has a function of producing carbon compounds by a reduction reaction of carbon dioxide. The carbon compounds produced by the reduction reaction are different depending on kinds or the like of reduction catalysts. Examples of the carbon compounds include carbon monoxide (CO), formic acid (HCOOH), methane ($CH_4$), methanol ($CH_3OH$), ethane ($C_2H_6$), ethylene ($C_2H_4$), ethanol ($C_2H_5OH$), formaldehyde (HCHO), acetaldehyde ($CH_3CHO$), acetic acid ($CH_3COOH$), ethylene glycol ($HOCH_2CH_2OH$), 1-propanol ($CH_3CH_2CH_2OH$), isopropanol ($CH_3CHOHCH_3$).

The reduction electrode 13 contains the conductive material and the reduction catalyst. For example, the reduction electrode 13 has a conductive layer 13a containing the conductive material, and a reduction catalyst layer 13b stacked on the conductive layer 13a and containing the reduction catalyst. The reduction catalyst layer 13b may be, for example, in a thin-film shape, a lattice shape, a granular shape, or a wire shape. The reduction electrode 13 may be made up of a single layer containing both of the conductive material and the reduction catalyst. In the case where the photovoltaic body 11 is not provided with the reflector 111, the reduction electrode 13 may be a layer of a material capable of coming into ohmic contact with the n-type semiconductor layer 112a in the photovoltaic body 11.

Examples of the conductive material include a metal such as Ag, Au, Al, Pd, Sn, Bi, or Cu, or an alloy material such as, for example, an SUS containing a plurality of metals. For example, the conductive layer 13a is made up of a substrate of the above-stated material, and thereby, it is possible to increase mechanical strength of an electrochemical reaction cell made up of the photovoltaic body 11, the oxidation electrode 12, and the reduction electrode 13. The light transmissive metal oxide such as ITO, ZnO, FTO, AZO, or ATO may be used as the conductive material. The reduction electrode 13 may be, for example, a stack of the metal and the light transmissive metal oxide, a layer containing the metal and another conductive material, or a layer containing the light transmissive metal oxide and another conductive material. There may be used a semiconductor substrate such as silicon and germanium, a conductive resin, a conductive ion exchange membrane and so on as the conductive material. Further, a resin material such as ionomer may be used.

Examples of the reduction catalyst include a material that decreases activation energy for reducing carbon dioxide, in other words, a material that lowers overpotential when producing the carbon compounds by the reduction reaction of carbon dioxide. For example, a metal material or a carbon material can be used. Examples of the metal material include Au, Ag, Cu, Pt, Ni, Zn, Pd and the like. Examples of the carbon material include carbon, graphene, carbon nanotube (CNT), fullerene, ketjen black, and the like. A metal complex such as the Ru complex or an Re complex may be used as the reduction catalyst. Further, a plurality of materials may be mixed.

Further, the reduction electrode 13 has a porous structure having fine pores through which the electrolytic solution 14 passes. The porous structure is formed by, for example, a method forming fine pores by processing a material which does not have the fine pores, a method using a porous material, and so on.

Examples of a material applicable for the reduction electrode 13 having the porous structure include a carbon black such as ketjen black and VULCAN XC-72, activated carbon, a metal fine powder, and so on in addition to the above-stated materials. For example, the material applicable for the reduction electrode 13 having the porous structure may be used for the conductive layer 13a.

The porous structure preferably has a fine pore distribution of 5 nm or more and 100 nm or less. The fine pore distribution enables to increase catalytic activity. Further, the porous structure preferably has a plurality of fine pore distribution peaks. It is thereby possible to simultaneously enable all of increase in a surface area, improvement in diffusibility of ions and reactants, and high conductivity. For example, the reduction catalyst layer 13b containing fine particles of the above-stated metal or alloy applicable for the reduction catalyst (fine-particle state reduction catalyst) of 100 nm or less may be stacked on the conductive layer 13a having the fine pore distribution of 5 micrometers or more and 10 micrometers or less. In this case, the fine particles may have the porous structure, but do not have to have the porous structure resulting from the conductivity and a relationship between a reaction site and substance diffusion. The fine particles may be held by other materials. It is thereby possible to improve the conductivity of the catalyst layer, diffusibility of gas, and a contact probability of catalytic particles, gaseous reaction molecules and ions, and reaction efficiency improves.

A size of the fine particle is preferably small, and for example, fine particles each of whose particle size is 10 nm or less preferably exceeds 50% of a total, more preferably 70% or more in a particle size distribution. An average particle size R and a standard deviation σ preferably satisfy a relationship of $R+2\sigma<10$ nm.

Here, there is described an example of a reduction reaction test of the reduction catalyst layer having ketjen black particles where gold particles are held as the fine particles. As a manufacturing method example of an evaluation sample for the reduction reaction test, paste is prepared by mixing the ketjen black particles where the gold particles are held (hereinafter, referred to just as ketjen black particles) and Nafion (registered trademark) at a rate of preferably approximately 1:3 (mass ratio) though it is not particularly limited. Next, the paste is coated on a carbon paper. Further, the carbon paper and an SUS substrate are adhered while sandwiching the conductive carbon paste such that an opposite face of a coating face of the paste of the carbon paper and the SUS substrate face with each other, then exposed surfaces, electrode connection parts and so on of the SUS substrate are sealed with an epoxy resin to thereby prepare the evaluation sample.

Figure 11:
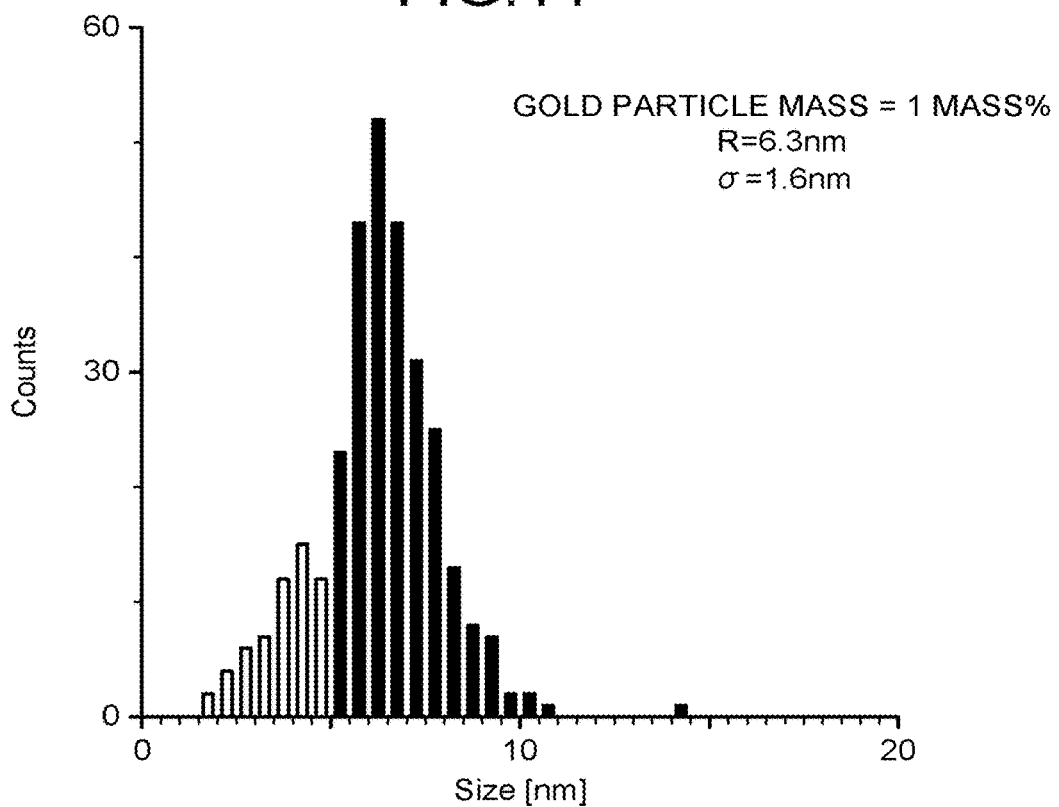
FIG. 11 is a view illustrating a particle-size distribution of gold particles in an evaluation sample.
Figure 12:
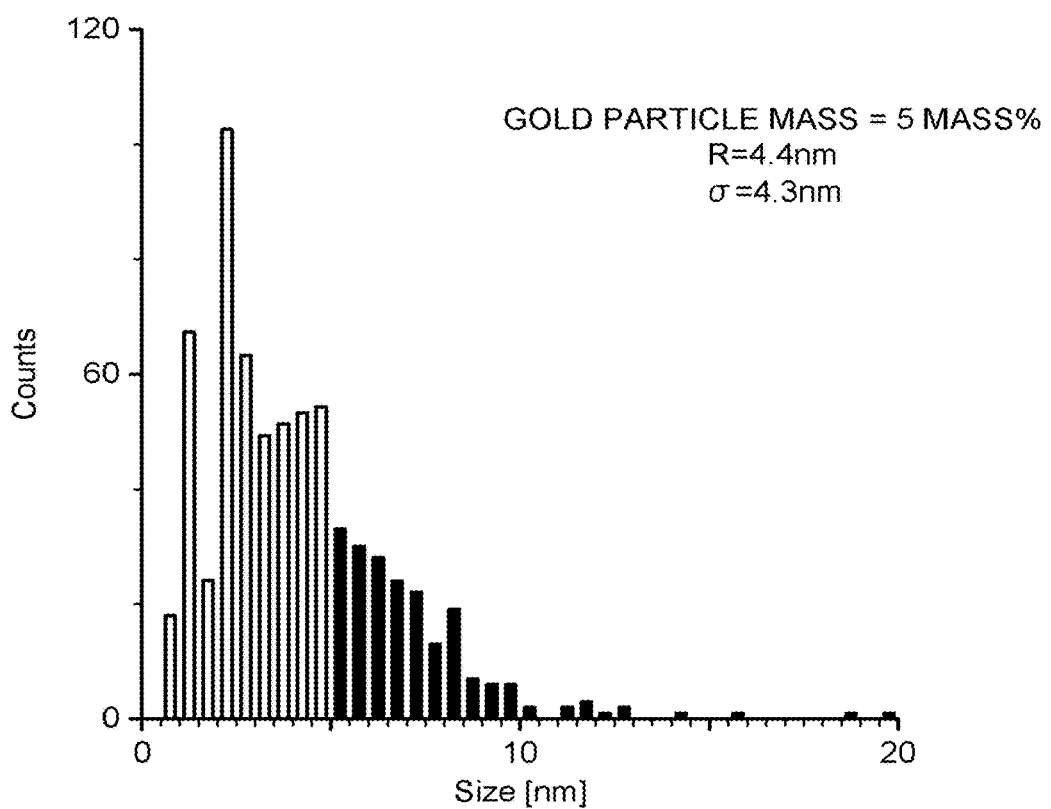
FIG. 12 is a view illustrating the particle-size distribution of the gold particles in the evaluation sample.
Figure 13:
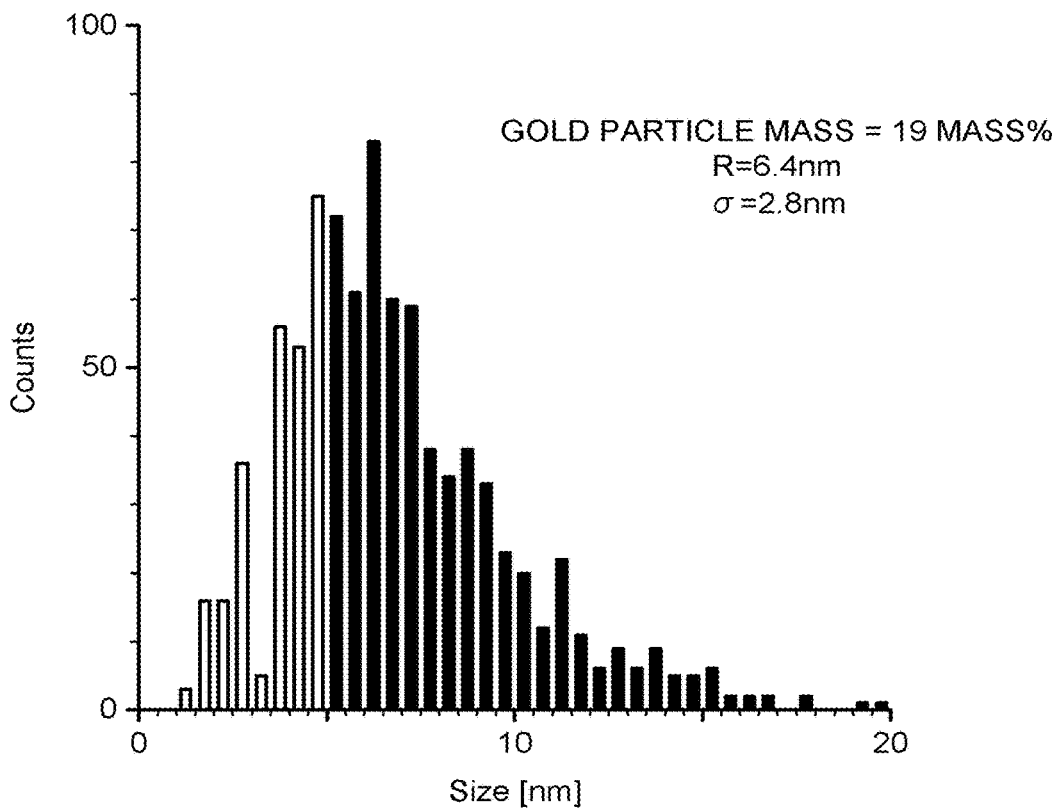
FIG. 13 is a view illustrating the particle-size distribution of the gold particles in the evaluation sample.
Figure 14:
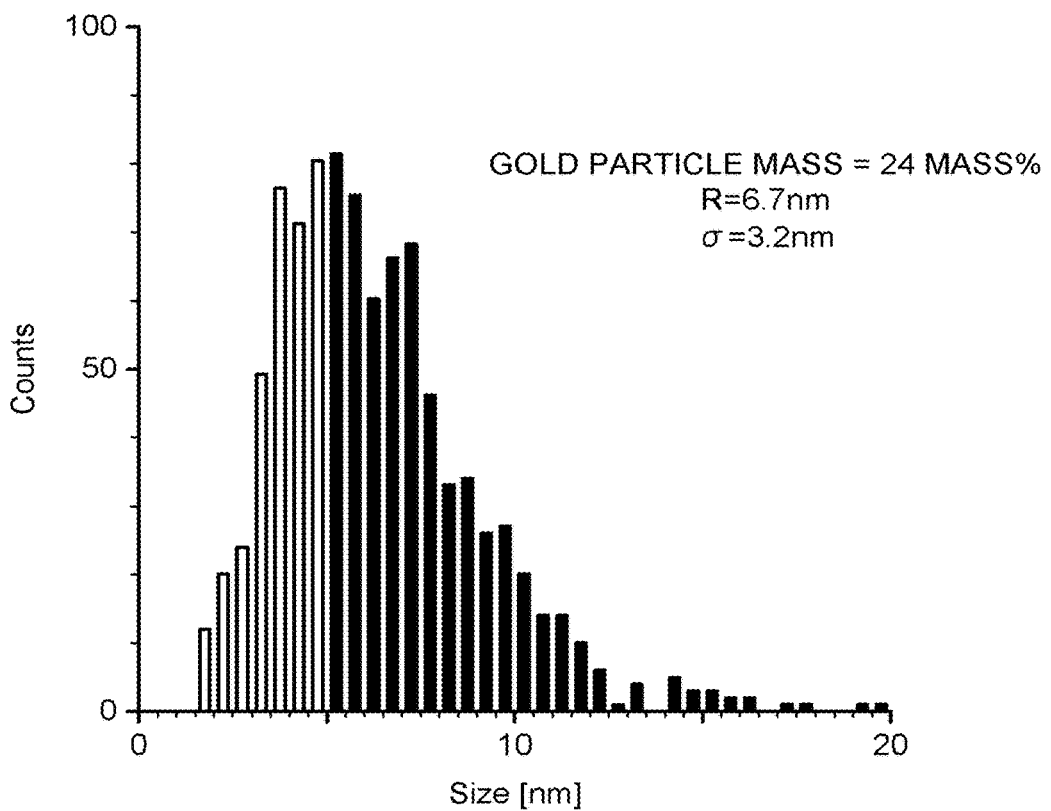
FIG. 14 is a view illustrating the particle-size distribution of the gold particles in the evaluation sample.

FIG. 11 to FIG. 14 are views each illustrating a particle size distribution of 300 pieces of gold particles in the evaluation sample. FIG. 11 is the particle size distribution of the evaluation sample where a gold particle mass % found by (gold particle mass/(gold particle mass+ketjen black mass))×100 is 1 mass %, FIG. 12 is the particle size distribution of the evaluation sample where the gold particle mass % is 5 mass %, FIG. 13 is the particle size distribution of the evaluation sample where the gold particle mass % is 19 mass %, and FIG. 14 is the particle size distribution of the evaluation sample where the gold particle mass % is 24 mass %. The average particle size R and the standard deviation σ of the gold particles in each evaluation sample are illustrated in each of FIG. 11 to FIG. 14. The gold particles are specified by, for example, an electron microscope, an X-ray crystal structure analysis, and the like. The particle size of the gold particle is measured by using measuring methods based on, for example, JISH7803 to JISH7805.

Figure 15:
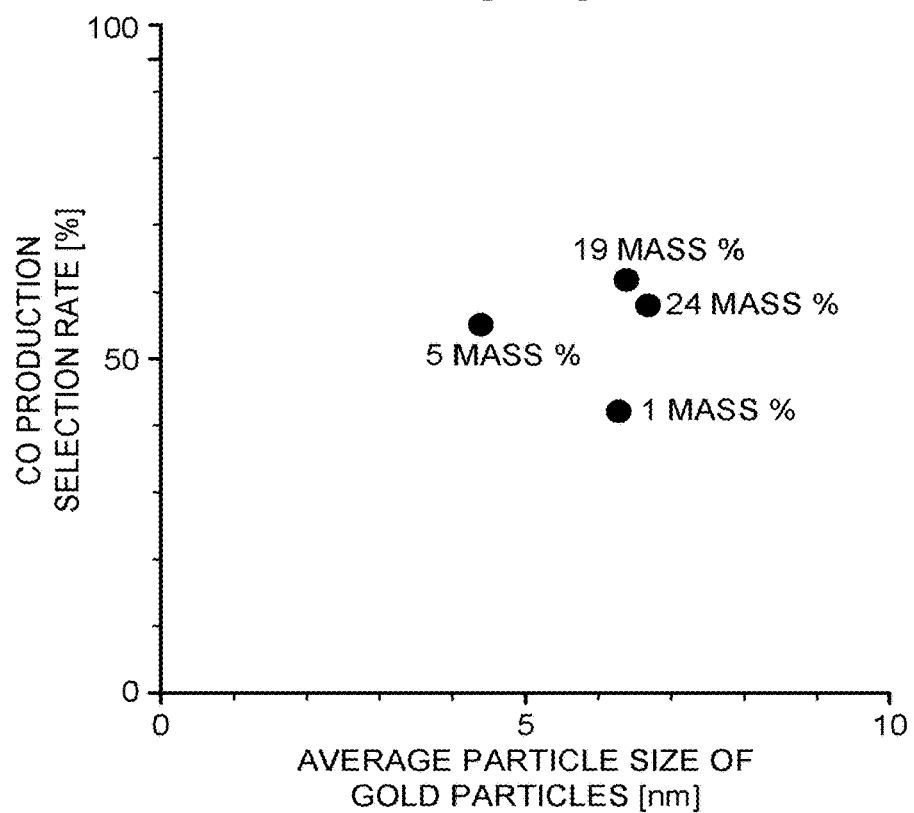
FIG. 15 is a view illustrating an average particle size of the gold particles and a production selection rate of carbon monoxide.
Figure 16:
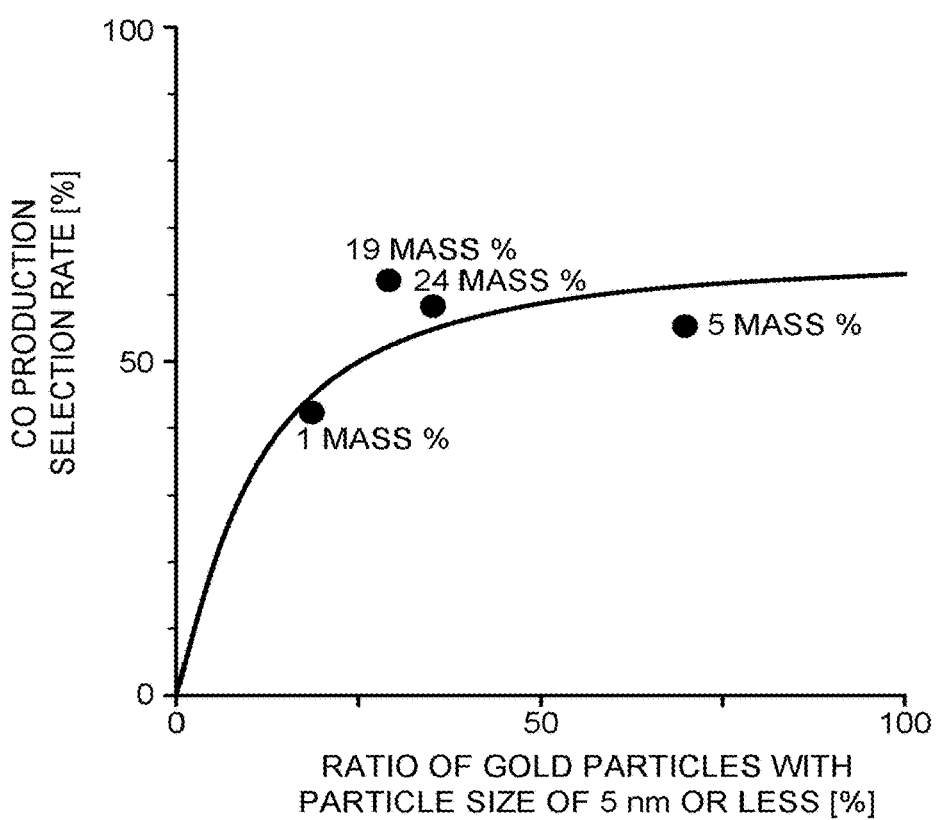
FIG. 16 is a view illustrating a relationship between a ratio of the gold particles each of whose particle size is 5 nm or less and the production selection rate of carbon monoxide.

FIG. 15 and FIG. 16 are views each illustrating a production selection rate of carbon monoxide (CO production selection rate) when a potential of −0.4 V (vs RHE (reversible hydrogen electrode)) is applied in an electrolytic solution where carbon dioxide is sufficiently injected into a 0.25 M sodium carbonate aqueous solution for the evaluation sample with 1 cm in length×1 cm in width×1 cm in thickness in the reduction reaction test. In this case, a thickness of the layer containing the ketjen black particles is 250 micrometers. The production selection rate of carbon monoxide is a production ratio of carbon monoxide among all substances produced by the reduction reaction.

FIG. 15 is the view illustrating a relationship between the average particle size of the gold particles and the production selection rate of carbon monoxide. As illustrated in FIG. 15, in each of the evaluation samples where the gold particle mass % are respectively 5 mass %, 19 mass %, and 24 mass %, the production selection rate of carbon monoxide exceeds 50%. On the other hand, in the evaluation sample where the gold particle mass % is 1 mass %, it can be seen that the production selection rate of carbon monoxide is less than 50%. It can be seen that there is a case when the production selection rate of carbon monoxide exceeds 50% even when the gold particle mass % is low. Further, it can be seen that there is not a remarkable correlation between the average particle size of the gold particles and the production selection rate of carbon monoxide.

On the other hand, FIG. 16 is a view illustrating a relationship between the ratio of the gold particles each of whose particle size is 5 nm or less and the production selection rate of carbon monoxide. A curve in FIG. 16 is an approximated curve based on values of respective evaluation samples. As illustrated in FIG. 16, it can be seen that in the evaluation sample where the ratio of the gold particles each of whose particle size is 5 nm or less exceeds 25% of a total number of fine particles, the production selection rate of carbon monoxide exceeds 50%.

It is conceivable that not only increasing a content of the gold particles but also increasing the ratio of the gold particles whose particle size is small are preferred to increase the production selection rate of the carbon compounds such as carbon monoxide from FIG. 11 to FIG. 16. For example, the surface area of the particle whose particle size is large is large, but an active face which contributes to the reduction reaction is small, and therefore, the production selection rate of the carbon compounds is difficult to increase. On the other hand, when the particle size becomes small, an edge face of an atom is easy to be exposed to a surface of the particle, and a ratio of the active face increases. Accordingly, an area which contributes to the reduction reaction increases, and the production selection rate of the carbon compounds can be increased.

The ratio of the active face becomes exponentially large as the particle size becomes small. For example, the sufficient active face is held when the particle size is 5 nm or less. In consideration of FIG. 11 to FIG. 16, it is preferable that, for example, the gold particles each of whose particle size is 5 nm or less is contained for 25% or more of a whole of the gold particles to increase the production selection rate of carbon monoxide to 50% or more.

In Non-Patent Reference 2, the average particle size of the gold particles is 4 nm to 10 nm. However, the production selection rate of carbon monoxide when the potential of −0.4 V (vs RHE) is applied in the reduction reaction test similar to the above is considered to be approximately 30% (Non-Patent Reference 2, FIG. 1c). Accordingly, it is conceivable that the ratio of the gold particles whose particle size is 5 nm or less is less than 25% of the whole of the gold particles in Non-Patent Reference 2. It is important to increase the area of the active face in addition to increase the surface area of the reduction catalyst layer so as to increase the production selection rate of the carbon compounds such as carbon monoxide.

The reduction electrode 13 preferably contains a surface active agent. The surface active agent is used, and thereby, desorption of gas or the like generated after the reaction from the reduction electrode 13 becomes easy. The surface active agent is used, and thereby, the fine particles are dispersed to be adsorbed to the porous structure, and the reaction can be accelerated.

Examples of the surface active agent include a vinyl compound having a hydrophilic group such as polyvinylpyrrolidone, polyvinyl alcohol, a derivative thereof, a polymer and so on. Other materials may be used as long as it is a material having equivalent functions.

The reduction electrode 13 preferably contains an ion exchange resin. For example, the ion exchange resin such as Nafion (registered trademark) is used, and thereby, it is possible to control adsorption of ions or the like which contribute to the reaction. Kinds of the ion exchange resins are no object according to usage, and a material having a function corresponding thereto may be used.

A projecting part with a height of 5 micrometers or less may be provided by processing a surface of the reduction catalyst layer 13b. The projecting part is provided, and thereby, an area of the reduction reaction increases, and conversion efficiency can be increased. It is possible to lower the overpotential at the reduction electrode 13, and to increase selectivity of reaction products.

The through hole 16b of the reduction electrode 13 is formed by removing a part of the reduction electrode 13 by, for example, etching or the like. The through hole 16b may be formed by the plurality of opening processes. When the reduction electrode 13 has the porous structure, the communicated fine pores may be provided to be regarded as the through hole 16b.

The reduction electrode 13 has the porous structure, and thereby, it is possible to increase diffusibility of ions and reactants through the fine pores while securing high conductivity and wide surface area of the active face. Supplies of products, raw material substances are limited due to diffusion of substances in accordance with increase in a reactant amount due to increase in the surface area of the active face. However, it is possible to simultaneously solve problems resulting from the above-stated limits owing to the porous structure.

In FIG. 1, a structure is illustrated in which the reduction electrode 13 has the porous structure, though not limited thereto, but the oxidation electrode 12 may have the porous structure. Both of the oxidation electrode 12 and the reduction electrode 13 may have the porous structure. In this case, the through hole 16a may be made up of fine pores of the oxidation electrode 12. Further, it may be configured such that the reduction electrode 13 is connected to the first face of the photovoltaic body 11, and the oxidation electrode 12 is connected to the second face of the photovoltaic body 11. In this case, the electrode on the light irradiation side needs to have the light transmitting property.

When the oxidation electrode 12 and the reduction electrode 13 are each the stack of the conductive layer and the catalyst layer, a protective layer may be provided between the conductive layer and the catalyst layer. Providing the protective layer makes it possible to prevent breakage of the photovoltaic body 11 due to the oxidation-reduction reaction using the light so as to increase the lifetime of the electrochemical reaction device. Examples of the protective layer include ITO. Further, Examples of the protective layer may include a dielectric such as $TiO_2$, $ZrO_2$, $Al_2O_3$, $SiO_2$, or $HfO_2$. In this case, setting a thickness of the protective layer to 10 nm or less, preferably 5 nm or less, provides electrical conductivity owing to the tunnel effect. The protective layer is made up of the ion exchange resin, and thereby, it is possible to add a shielding function of ions in addition to the function as the protective body, and therefore, there is a case when an ion exchange membrane is not necessary to be additionally provided.

In the case where the oxidation electrode 12 and the reduction electrode 13 are each formed in a stacked structure made up of the conductive layer and the catalyst layer, the oxidation reaction or the reduction reaction can be directly generated by the catalyst when charge separation is performed by the photovoltaic body 11, so that the conversion efficiency from the light to the chemical substance can be increased. Further, the structure that the oxidation electrode 12 or the reduction electrode 13 is in contact with the photovoltaic body 11 eliminates necessity to use wiring for connecting the photovoltaic body 11 to the oxidation electrode 12 or the reduction electrode 13, thus simplifying the system. When they are not stacked as illustrated in FIG. 4, resistance loss is generated due to a transparent electrode such as a soler cell, but efficiency improves by being stacked. Further, it is possible to increase the electrode area. The oxidation electrode 12 or the reduction electrode 13 may be formed at least at a part of the photovoltaic body 11. A plurality of oxidation electrodes 12, a plurality of reduction electrodes 13 may be provided. In this case, substances produced at respective electrodes may be different.

Sizes or shapes of the photovoltaic body 11, the oxidation electrode 12, and the reduction electrode 13 are not limited to ones in FIG. 1. For example, the sizes of the photovoltaic body 11, the oxidation electrode 12, and the reduction electrode 13 may be different from one another.

The electrolytic solution 14 is stored in a container such as, for example, an electrolytic tank. The electrolytic solution 14 has a first region 14a and a second region 14b. In the electrolytic solution 14, the photovoltaic body 11, the oxidation electrode 12, and the reduction electrode 13 are immersed as illustrated in FIG. 1, where the oxidation electrode 12 is immersed in the first region 14a, and the reduction electrode 13 is immersed in the second region 14b.

The electrolytic solution 14 may be replenished from a supply flow path. Since little substance only needs to be supplied to a large area because of low energy by the sunlight, a system in which modules each having an area of over 1 $m^2$ are coupled by the supply flow path or a system in which at least an oxidation electrode and a reduction electrode are provided in the supply flow path in a pipe shape, may be used. In this case, a heater and a temperature sensor may be provided at a part of the supply flow path. Further, a vaporized electrolytic solution 14 component may be filled in the container.

The electrolytic solution 14 contains water ($H_2O$) and carbon dioxide ($CO_2$). Examples of the electrolytic solution 14 include aqueous solutions containing phosphoric acid ions ($PO_4^{2-}$), boric acid ions ($BO_3^{3-}$), sodium ions ($Na^+$), potassium ions ($K^+$), calcium ions ($Ca^{2+}$), lithium ions ($Li^+$), cesium ions ($Cs^+$), magnesium ions ($Mg^{2+}$), chloride ions ($Cl^-$), hydrogen carbonate ions ($HCO^{3-}$) and so on. Examples of the electrolytic solution 14 include an aqueous solution containing $LiHCO_3$, $NaHCO_3$, $KHCO_3$, $CsHCO_3$ or the like. The electrolytic solution 14 may contain alcohols such as methanol, ethanol, acetone. The electrolytic solution where the oxidation electrode 12 is immersed and the electrolytic solution where the reduction electrode 13 is immersed may be set to separated electrolytic solutions. In this case, it is preferable that the electrolytic solution where the oxidation electrode 12 is immersed contains at least water, and the electrolytic solution where the reduction electrode 13 is immersed contains at least carbon dioxide. A production ratio of the carbon compounds may be changed by changing an amount of water contained in the electrolytic solution where the reduction electrode 13 is immersed. Further, carbon dioxide may be injected by bubbling or the like into at least one of the first region Ma or the second region 14b.

Examples of the electrolytic solution 14 include an ionic liquid which is made up of salts of cations such as imidazolium ions or pyridinium ions and anions such as $BF_4^-$ or $PF_6^-$ and which is in a liquid state in a wide temperature range, or its aqueous solution. Further, as other electrolytic solutions, there can be cited amine solutions such as ethanolamine, imidazole, and pyridine, or aqueous solutions thereof. Examples of the amine include primary amine, secondary amine, tertiary amine, and so on.

Examples of the primary amine include methylamine, ethylamine, propylamine, butylamine, pentylamine, hexylamine, and so on. Hydrocarbons of the amine may be substituted by alcohol, halogen, and so on. Examples of the amine whose hydrocarbons are substituted include methanolamine, ethanolamine, chloromethyl amine, and so on. Further, an unsaturated bond may exist. These hydrocarbons are also applied to the secondary amine and the tertiary amine.

Examples of the secondary amine include dimethylamine, diethylamine, dipropylamine, dibutylamine, dipentylamine, dihexylamine, dimethanolamine, diethanolamine, dipropanolamine, and so on. The substituted hydrocarbons may be different. This also applies to the tertiary amine. For example, as an example whose hydrocarbons are different, there can be cited methylethylamine, methylpropylamine, and so on.

Examples of the tertiary amine include trimethylamine, triethylamine, tripropylamine, tributylamine, trihexylamine, trimethanolamine, triethanolamine, tripropanolamine, tributanolamine, triexanolamine, methyl diethylamine, methyldipropylamine, and so on.

Examples of the cations of the ionic liquid include
1-ethyl-3-methylimidazolium ions, 1-methyl-3-propylimidazolium ions,
1-butyl-3-methylimidazole ions, 1-methyl-3-pentylimidazolium ions,
1-hexyl-3-methylimidazolium ions, and so on.

A second place of the imidazolium ions may be substituted. Examples of the cations whose second place of the imidazolium ions is substituted include
1-ethyl-2,3-dimethylimidazolium ions, 1,2-dimethyl-3-propylimidazolium ions,
1-butyl-2,3-dimethylimidazolium ions, 1,2-dimethyl-3-pentylimidazolium ions,
1-hexyl-2,3-dimethylimidazolium ions, and so on.

Examples of the pyridinium ions include methylpyridinium, ethylpyridinium, propylpyridinium, butylpyridinium, pentylpyridinium, hexylpyridinium, and so on. In both of the imidazolium ions and the pyridinium ions, an alkyl group may be substituted, or an unsaturated bond may exist.

Examples of the anions include fluoride ions, the chloride ions, the bromide ions, the iodide ions, $BF_4^-$, $PF_6^-$, $CF_3COO^-$, $CF_3SO_3^-$, $NO_3^-$, $SCN^-$, $(CF_3SO_2)_3C^-$, bis(trifluoromethoxysulfonyl)imide, bis(perfluoroethylsulfonyl)imide, and so on. Dipolar ions in which the cations and the anions of the ionic liquid are coupled by hydrocarbons may be used.

A pH value of the second region 14b is preferably lower than a pH value of the first region 14a. It is thereby possible for the hydrogen ions, hydroxide ions, and so on to move easily. A liquid junction potential difference resulting from a difference in the pH values is effectively used for the oxidation-reduction reaction. The pH difference is generated resulting from the supply of carbon dioxide by bubbling or the like, then the potential difference is obtained between the region 14b and the region 14a, and thereby, efficiency can be improved. Accordingly, a not-illustrated $CO_2$ supply pipe is preferably provided.

The ion exchange membrane 15a is provided between the first region 14a and the second region 14b, and the ion exchange membrane 15b is provided to block the through hole 16b penetrating through the reduction electrode 13. The ion exchange membrane 15b may be provided to block at least one of the through hole 16a to the through hole 16c. The ion exchange membrane 15b is formed by, for example, immersing a formation object body where a through hole is provided into a solution containing the ion exchange resin. The ion exchange membrane 15a and the ion exchange membrane 15b each have a function of allowing permeation of a part of ions contained in the electrolytic solution 14, namely, a function of blocking one kind or more ions contained in the electrolytic solution 14 between the first region 14a and the second region 14b. It is thereby possible to make the pH values different between, for example, the first region 14a and the second region 14b.

Examples of the ion exchange membrane 15a and the ion exchange membrane 15b include cation exchange membranes such as Nafion (registered trademark) and Flemion (registered trademark), anion exchange membranes such as Neosepta (registered trademark) and Selemion (registered trademark). The ion exchange membrane 15a and the ion exchange membrane 15b may be made up of different materials. The ion exchange membrane 15a and the ion exchange membrane 15b may be provided with ion permeation holes and glass filter or agar may be filled in the ion permeation holes. In the case where there is no need to control moving of ions between the first region 14a and the second region 14b of the electrolytic solution 14 such that the same electrolytic solution component reacts in the oxidation electrode 12 and the reduction electrode 13, the ion exchange membrane 15a and the ion exchange membrane 15b are not necessarily provided. A surface area of the ion exchange membrane 15b is preferably larger than a diameter of the through hole 16c. Further, a center part of the ion exchange membrane 15b is preferably thinner than a peripheral part. It is thereby possible to improve the diffusibility of ions and to improve efficiency.

Next, an operation example of the electrochemical reaction device illustrated in FIG. 1 will be described with reference to FIG. 3. Here, the case of producing carbon monoxide will be described as an example. FIG. 3 is a schematic view for explaining the operation example of the electrochemical reaction device 10. As illustrated in FIG. 3, light 2 is incident on the photovoltaic body 11 through the oxidation electrode 12. The light 2 is preferably the sunlight but, not limited to this, may be, for example, light of a light emitting diode, an organic EL or the like. When the light 2 is incident, the photovoltaic body 11 absorbs the light 2 and generates and separates photoexcited electrons and holes. At this time, the holes gather at the oxidation electrode 12 side and the photoexcited electrons gather at the reduction electrode 13 side. This causes electromotive force in the photovoltaic body 11.

When the holes gather at the oxidation electrode 12, the oxidation reaction of water occurs as in the following formula (1) to produce oxygen and hydrogen ions.

$$2H_2O \rightarrow 4H^+ + O_2 + 4e^- \quad (1)$$

The hydrogen ions produced by the oxidation reaction permeate the ion exchange membrane 15a and the ion exchange membrane 15b to move to the reduction electrode 13 side. The diffusibility of substances such as ions can be increased by permeating the ion exchange membrane 15b.

When the photoexcited electrons gather at the reduction electrode 13, the reduction reaction of carbon dioxide occurs as in the following formula (2), and carbon dioxide and the hydrogen ions react to produce carbon monoxide being the carbon compound and water. Carbon monoxide dissolves in the electrolytic solution 14 at an arbitrary ratio. An area where the reduction reaction occurs at the reduction electrode 13 having the porous structure is larger than an electrode which does not have the porous structure. A recovery flow path may be provided at a storage container of the electrolytic solution 14, and the produced carbon compounds may be recovered through the recovery flow path.

$$2CO_2 + 4H^+ + 4e^- \rightarrow 2CO + 2H_2O \quad (2)$$

In this event, the photovoltaic body 11 needs to have an open-circuit voltage equal to or more than a potential difference between a standard oxidation-reduction potential of the oxidation reaction and a standard oxidation-reduction potential of the reduction reaction. For example, the standard oxidation-reduction potential of the oxidation reaction in the formula (1) is 1.23 [V], and the standard oxidation-reduction potential of the reduction reaction in the formula (2) is −0.11 [V]. Accordingly, the open-circuit voltage of the photovoltaic body 11 needs to be set to 1.33 [V] or more. Further, the open-circuit voltage of the photovoltaic body 11 is preferably equal to or more than the potential difference including the overpotential. For example, when the overpotentials of the oxidation reaction in the formula (1) and the reduction reaction in the formula (2) are both 0.2 [V], the open-circuit voltage is preferably 1.73 [V] or more.

Further, the hydrogen ions move from the first region 14a to the second region 14b through the ion exchange membrane 15a. Similarly, the hydrogen ions move from the first region 14a to the second region 14b through the ion exchange membrane 15b of the through hole 16. As it can be seen from FIG. 3, the hydrogen ions move through the through hole 16, and thereby, it is possible to largely shorten a moving distance of ions from the oxidation electrode 12 to the reduction electrode 13, and therefore, it is possible to increase ion diffusibility while lowering resistance between electrodes.

The reduction reaction of carbon dioxide is the reaction consuming the hydrogen ions. Accordingly, when the amount of the hydrogen ions moving from the oxidation electrode 12 side to the reduction electrode 13 side is small, efficiency of the reduction reaction becomes worse. It is therefore preferable that the concentration of the hydrogen ions in the first region 14a and the concentration of the hydrogen ions in the second region 14b are made different in advance to make it easy to move the hydrogen ions owing to the concentration difference. The concentration of the hydroxide ions may be made different between the first region 14a and the second region 14b.

As described above, the electrochemical reaction device of the embodiment includes the electrodes each having the porous structure. It is thereby possible to lower the overpotential at the electrode and to lower the resistance between the electrodes while increasing the surface area of the electrode and increasing diffusibility of ions and reactants. In general, carbon dioxide is stable, overpotential is easy to become high, and conversion efficiency from the light to the chemical substances is easy to become low. On the other hand, according to the electrochemical reaction device of the embodiment, it is possible to suppress unnecessary consumption of light energy of the sunlight or the like, and therefore, conversion energy from the light to the carbon compounds can be improved. In the electrochemical reaction device of the embodiment, it is possible to reduce manufacturing cost. In the electrochemical reaction device of the embodiment, the electrochemical reaction cell in itself functions as a partition, and it is possible to isolate products, and therefore, a separation process of the products is not necessary to be additionally provided.

The electrochemical reaction device of the embodiment is not limited to the structure illustrated in FIG. 1. Other structure examples of the electrochemical reaction device in the embodiment are described with reference to FIG. 4 to FIG. 6, FIG. 8 to FIG. 10, and FIG. 23 to FIG. 25. FIG. 4 to FIG. 6, FIG. 8 to FIG. 10, and FIG. 23 to FIG. 25 are schematic views illustrating other structure examples of the electrochemical reaction device. In the electrochemical reaction devices illustrated in FIG. 4 to FIG. 6, FIG. 8 to FIG. 10, and FIG. 23 to FIG. 25, description in FIG. 1 is appropriately cited as for parts similar to the electrochemical reaction device illustrated in FIG. 1.

The electrochemical reaction device 10 illustrated in FIG. 4 is at least different in a point that the photovoltaic body 11 is included to be separated from the electrolytic solution 14 compared to the electrochemical reaction device 10 illustrated in FIG. 1. In this case, the oxidation electrode 12 is connected to the first face of the photovoltaic body 11 and the reduction electrode 13 is connected to the second face by using, for example, wirings or the like. The ion exchange membrane 15a may be provided between the oxidation electrode 12 and the reduction electrode 13. The ion exchange membrane 15b may not be provided. The photovoltaic body 11 is provided to be separated from the electrolytic solution 14, and thereby, it is possible to suppress deterioration of the photovoltaic body 11 due to the electrolytic solution 14. Further, it is a structure having the electrolytic solution 14 between the oxidation electrode 12 and the reduction electrode 13, and therefore, resistance between the oxidation electrode 12 and the reduction electrode 13 is low, and the ion diffusibility improves. In this case, one of the oxidation electrode 12 and the reduction electrode 13 may not have the porous structure. The through hole 16 may not be provided. Spaces between the oxidation electrode 12 and the reduction electrode 13 with the ion exchange membrane 15a are preferably narrow. The resistance between the oxidation electrode 12 and the reduction electrode 13 can be thereby lowered. Further, a stacked structure without any space may be applicable. There is no necessity for the electrode in this structure to have the light transmitting property.

The electrochemical reaction device 10 illustrated in FIG. 5 is at least different in a point that an electrode layer 13c having a reduction catalyst function is included as the reduction electrode 13 compared to the electrochemical reaction device 10 illustrated in FIG. 1. For example, the conductive material and the reduction catalyst applicable for the reduction electrode 13 are contained as the electrode layer 13c. The conductive material and the reduction catalyst may be the same material. The reduction electrode 13 is made up of the electrode layer 13c containing both the conductive material and the reduction catalyst, and thereby, the number of parts is decreased, and the manufacturing cost or the like can be reduced.

Figure 6:
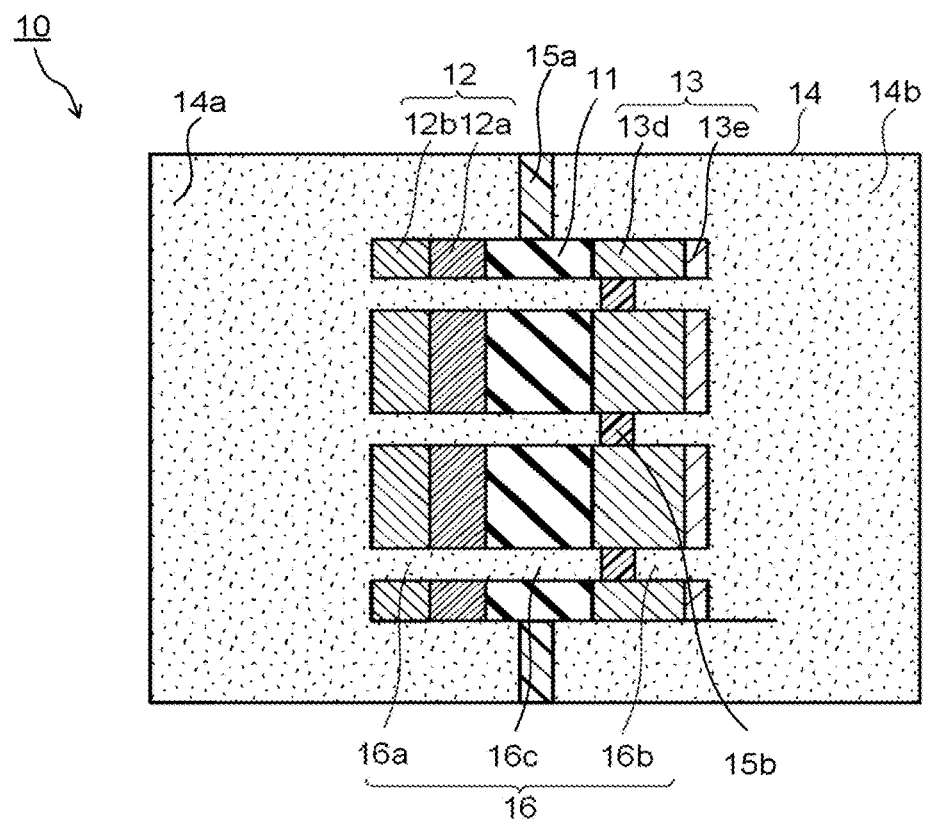
FIG. 6 is a schematic view illustrating another structure example of the electrochemical reaction device.

The electrochemical reaction device 10 illustrated in FIG. 6 is at least different in a point that a porous conductive layer 13d and a porous catalyst layer 13e stacked on the porous conductive layer 13d and having the porous structure containing the reduction catalyst are included as the reduction electrode 13 compared to the electrochemical reaction device 10 illustrated in FIG. 1. For example, a mixture of conductive particles such as Nafion and ketjen black can be used as the porous conductive layer 13d, and a gold catalyst can be used as the porous catalyst layer 13e. Further, a surface of the porous catalyst layer 13e is oxidized by applying high frequency, and thereafter, it is electrochemically reduced to thereby form the reduction electrode 13 having a nanoparticle structure. Metals such as copper, palladium, silver, zinc, tin, bismuth, lead are preferable other than gold. The porous conductive layer 13d may further have a stacked structure where respective layers have different pore sizes. The stacked structure with different pore sizes enables to improve efficiency by adjusting, for example, difference in reaction caused by difference in reaction product concentrations in a vicinity of the electrode, difference in pH values and so on by the pore sizes.

Figure 7:
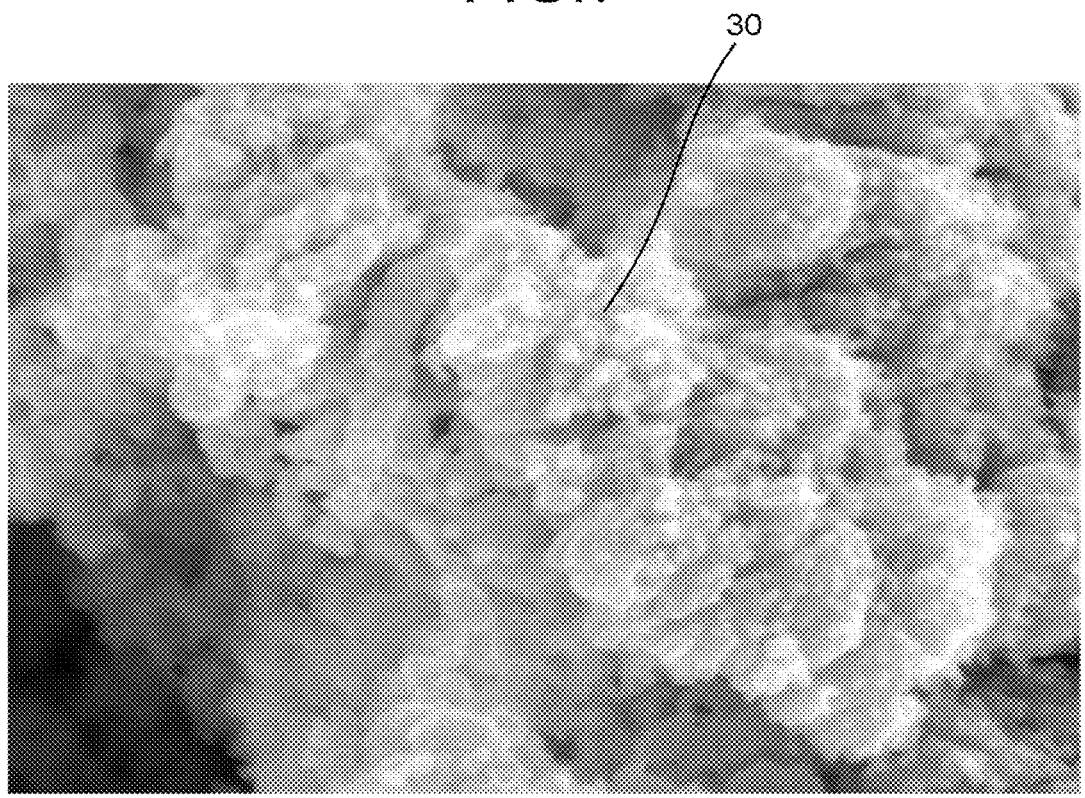
FIG. 7 is an observation image illustrating a structure of a gold catalyst.

An observation image by a scanning electron microscope of the gold catalyst after oxidation is illustrated in FIG. 7 as an example. As illustrated in FIG. 7, a gold catalyst 30 has the porous structure. Electrochemical reduction is performed with a 0.5 M sodium carbonate aqueous solution by using this gold catalyst 30, then for example, it is reduced to carbon monoxide with Faraday's efficiency of 90% or more. For example, when the reduction is performed in sulfuric acid, hydrogen is mainly produced. In this case, it is stoichiometrically suited to produce hydrogen and carbon monoxide at a rate of 1:2 when methanol is produced as an end product. A current density when the potential of −0.4 V (vs RHE) is applied at this time is approximately 7 mA/cm$^2$. The reduction catalyst layer 13b having the nanoparticle structure may be formed by anodically oxidizing and thereafter electrochemically reducing a surface of the gold catalyst. At this time, the electrochemical reduction is performed with the 0.5 M sodium carbonate aqueous solution, then it is reduced to hydrogen as a main product. These catalysts having different characteristics are combined to produce hydrogen and CO at a rate of, for example, 1:2 to make a composition suitable for synthesis of methanol. A reduction current at this time is extremely large compared to the gold catalyst on a smooth plate. The gold catalyst may have, for example, a cuboctahedron structure. The gold catalyst preferably has crystal planes at (111) plane and (100) plane. Metal catalysts such as, for example, platinum, nickel, iron, titanium are suitable to manufacture hydrogen.

When the porous catalyst layer 13e having the nanoparticle structure is formed by using the high frequency, for example, the high frequency is applied to a conductive layer to be the porous catalyst layer 13e in an electrolytic solution. Examples of the conductive layer to be the porous catalyst layer 13e include a metal film containing the metal applicable for the porous catalyst layer 13e and formed by a conventional deposition method such as sputtering.

When a standard electrode potential is set as a reference, it is preferable that a maximum potential of high frequency is an oxidation potential of the porous catalyst layer 13e or more, and a minimum potential is a reduction potential of the porous catalyst layer 13e or less. Namely, the potential of the high frequency periodically varies in a range from a value of the oxidation potential of the porous catalyst layer 13e or more to a value of the reduction potential of the porous catalyst layer 13e or less. The above-stated high frequency is applied, and thereby, the porous catalyst layer 13e having the nanoparticle structure is formed.

The oxidation potential may be a potential higher than the oxidation potential capable of shifting a valence from, for example, zero-valence to a plus side independent from the valence of metal species. The reduction potential may be a potential lower than the reduction potential capable of shifting the metal species from zero-valence to a minus side. The oxidation potential is a potential, for example, changing such as $M^0 \rightarrow M^+$, $M^+ \rightarrow M^{2+}$, in case of a metal named M. The reduction potential is a potential changing, for example, such as $M^+ \rightarrow M^0$, $M^{2+} \rightarrow M^+$.

For example, the oxidation potential of the porous catalyst layer 13e is a potential capable of shifting the valence from zero-valence to a positive valence if the porous catalyst layer 13e is a metal. When the porous catalyst layer 13e is oxide or the like, and already has the positive valence, it is a potential capable of shifting to a further positive valence than the value.

The reduction potential of the porous catalyst layer 13e is a potential capable of shifting the valence from the positive valence to zero-valence if the porous catalyst layer 13e is a metal. When the porous catalyst layer 13e is oxide or the like, and already has the positive valence, it is a potential capable of returning the valence to the value.

FIG. 17 and FIG. 18 are schematic views each illustrating a mechanism when a nanoparticle structure is formed by using a high-frequency potential. In each of FIG. 17 and FIG. 18, a state where an oxide layer 22 of a metal layer 21 is gradually formed on a surface of the metal layer 21 with a lapse of time such that a reaction proceeds from left to right in FIG. 17 and FIG. 18.

For example, as described in Non-Patent Reference 1, when a high frequency having a minimum potential which is the reduction potential of the porous catalyst layer 13e or more and a maximum potential which is the oxidation potential of the porous catalyst layer 13e or more is applied, only the oxidation reaction is intermittently repeated as illustrated in FIG. 17. The surface of the metal layer 21 is oxidized by the oxidation reaction, and thereby, the oxide layer 22 is formed. The oxide layer 22 becomes thick every period when the oxidation reaction occurs. As the oxide layer 22 becomes gradually thick, current becomes difficult to pass, and therefore, oxidation speed becomes gradually slow.

On the other hand, when a high frequency having a minimum potential which is the reduction potential of the porous catalyst layer 13e or less and a maximum potential which is the oxidation potential of the porous catalyst layer 13e or more is applied, the oxidation reaction and the reduction reaction are alternately repeated as illustrated in FIG. 18. When the oxide layer 22 is reduced, the oxide layer 22 becomes thin. The current passes easily through the oxide layer 22 which gets thinner, and therefore, the oxidation reaction is easy to proceed when it is oxidized again. The oxidation and the reduction are repeated, and thereby, contraction and expansion are repeated between metal elements in the porous catalyst layer 13e. It is thereby possible to effectively make the oxide layer 22 thick compared to the case in FIG. 17. Accordingly, a surface area of the porous catalyst layer 13e increases, and reactivity improves.

A thickness of the oxide layer 22 is preferably, for example, 1 micrometer or more and 10 micrometer or less. A production reaction of the oxide layer 22 proceeds not only in a thickness direction but also in a direction perpendicular to the thickness direction of the porous catalyst layer 13e. The high frequency is adjusted, and thereby, for example, a reduction reaction time may be made shorter than an oxidation reaction time.

Figure 19:
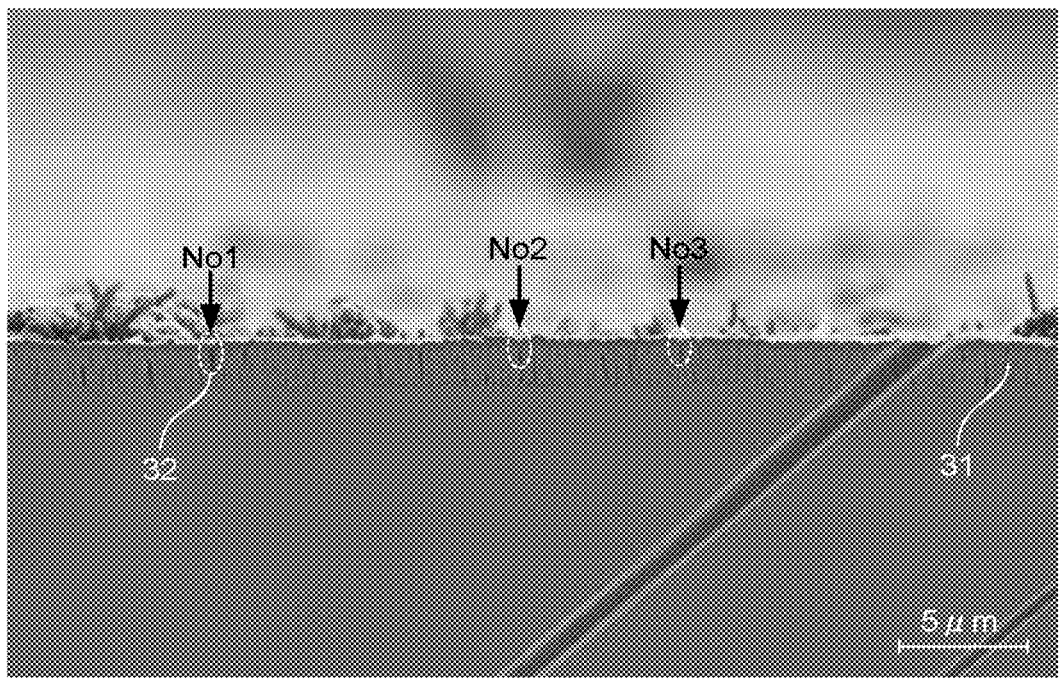
FIG. 19 is a cross-sectional observation image of a porous catalyst layer by a scanning electron microscope.
Figure 20:
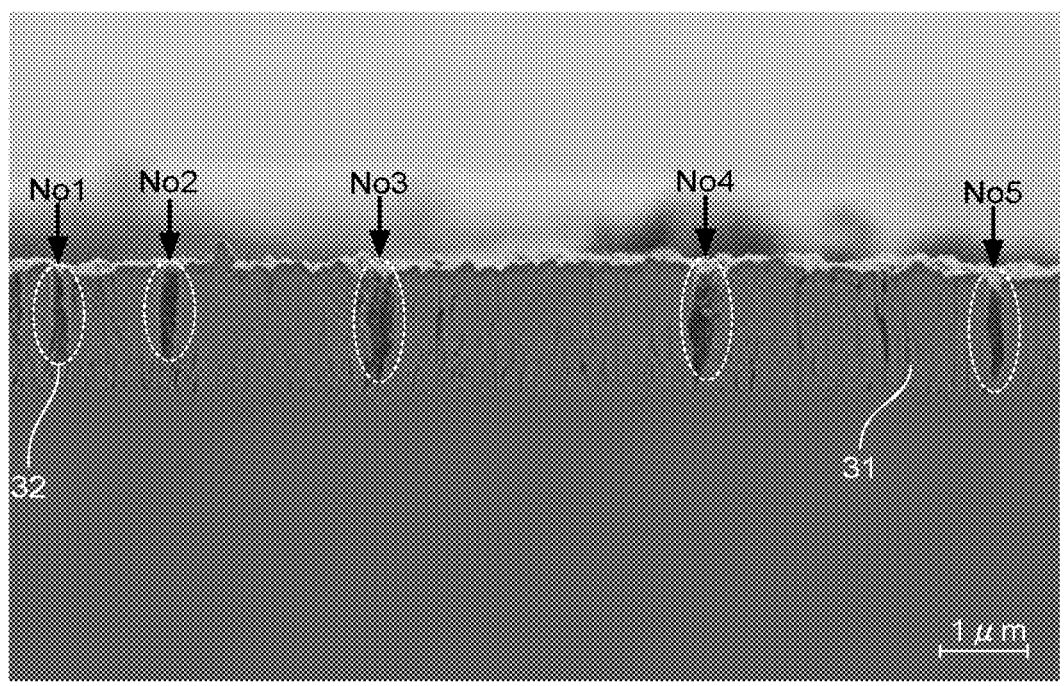
FIG. 20 is the cross-sectional observation image of the porous catalyst layer by the scanning electron microscope.

FIG. 19 and FIG. 20 are each a cross-sectional observation image of a porous catalyst layer made up of gold by a scanning electron microscope (SEM). FIG. 19 is the cross-sectional observation image of the porous catalyst layer which is formed by applying a high frequency (a high frequency at 0.7-2 V (vs Hg/HgSO$_4$: 0.5 M, H$_2$SO$_4$ aqueous solution)) where a minimum potential is the reduction potential of gold or more and a maximum potential is the oxidation potential of gold or more. FIG. 20 is the cross-sectional observation image of the porous catalyst layer which is manufactured by applying a high frequency (a high frequency at 0-2 V (vs Hg/HgSO$_4$: 0.5 M, H$_2$SO$_4$ aqueous solution)) where a minimum potential is the reduction potential of gold or less and a maximum potential is the oxidation potential of gold or more.

The porous catalyst layers illustrated in FIG. 19 and FIG. 20 are each the porous catalyst layer formed by applying the above-stated high frequency with a frequency of 1000 Hz in a 0.5 M sulfuric acid electrolytic solution, for example, for a gold film with 1 cm in length×1 cm in width×100 micrometers in thickness. An electrode connection part, a rear face and so on of the gold film are sealed by a dicing film or the like.

As illustrated in FIG. 19 and FIG. 20, a porous catalyst layer 31 formed by applying the high frequency where the minimum potential is the reduction potential of gold or less and the maximum potential is the oxidation potential of gold or more is thicker than the porous catalyst layer 31 formed by applying the high frequency where the minimum potential is the reduction potential of gold or more.

Three pieces of voids 32 each with a width of 50 nm or more from No. 1 to No. 3 are observed in a range of 40 micrometers in width of the porous catalyst layer 31 in FIG. 19, and five pieces of voids 32 each with a width of 50 nm or more from No. 1 to No. 5 are observed in a range of 40 micrometers in width of the porous catalyst layer 31 in FIG. 20. It can be seen that a plurality of voids 32 extending to a surface of the porous catalyst layer 31 are numerously formed when the high frequency where the minimum potential is the reduction potential of gold or less and the maximum potential is the oxidation potential of gold or more is applied compared to the case when the high frequency where the minimum potential is the reduction potential of gold or more is applied. The voids 32 each with the width of 50 nm or more are numerously provided at the porous catalyst layer 31, and thereby, the surface area which contributes to the reduction reaction becomes large to increase reactivity.

Figure 21:
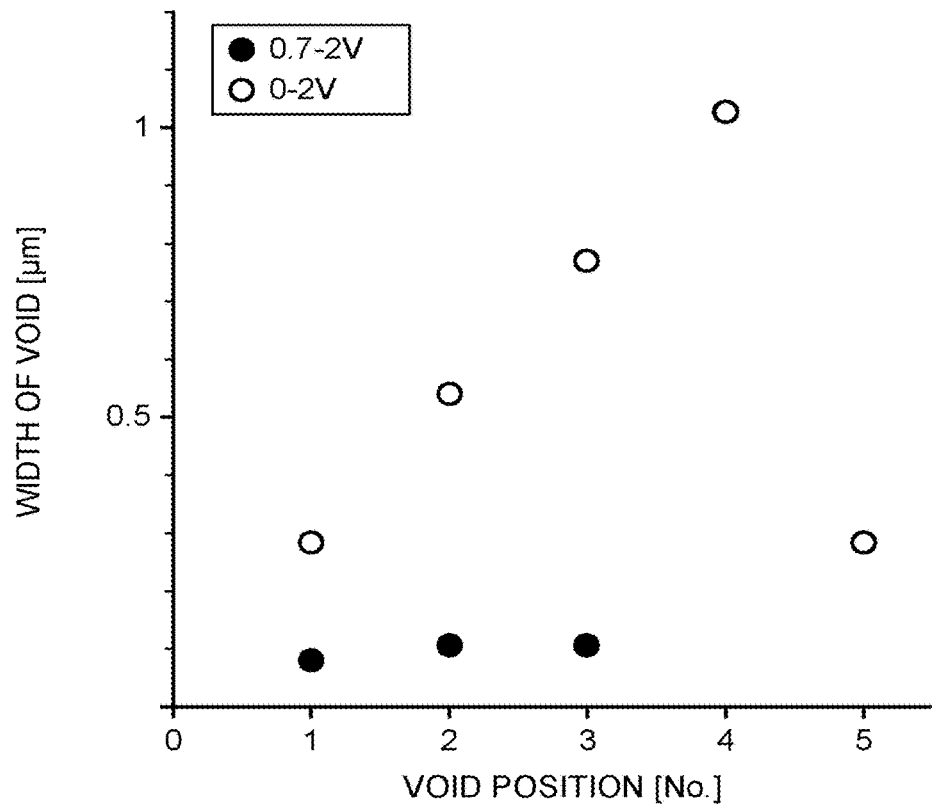
FIG. 21 is a view illustrating a width of a void.

FIG. 21 is a view illustrating the width of the void. A horizontal axis in FIG. 21 represents No. of observed voids each having the width of 50 nm or more, and a vertical axis represents the width of the void at the surface of the porous catalyst layer.

As illustrated in FIG. 21, all of the widths of the voids 32 from No. 1 to No. 5 (white circles) illustrated in FIG. 20 are each 100 nm (0.1 micrometers) or more. Further, the widths of the voids 32 from No. 2 to No. 4 illustrated in FIG. 20 are each 300 nm (0.3 micrometers) or more. All of the widths of the voids 32 from No. 1 to No. 5 illustrated in FIG. 20 are wider than the widths of the voids 32 from No. 1 to No. 3 (black circles) illustrated in FIG. 19. Namely, it can be seen from FIG. 21 that the voids each having the width of 100 nm or more numerously exist in the porous catalyst layer formed by applying the high frequency of 0-2 V compared to the porous catalyst layer formed by applying the high frequency of 0.7-2 V (vs Hg/HgSO$_4$: 0.5 M, H$_2$SO$_4$ aqueous solution). The reduction catalyst layer preferably has, for example, three pieces or more of voids each having the width of 300 nm or more in a range of 40 micrometers in width, or five pieces or more of voids each having the width of 100 nm or more in a range of 40 micrometers in width.

The voids are held, and thereby, it is possible to make the surface area which contributes to the reduction reaction sufficiently large. The number and the width of voids change depending on, for example, the frequency of the high frequency, an applying time, and so on. The width, and the number of voids are calculated from, for example, the cross-sectional observation image by the SEM. The width of the void becomes wider, and thereby, the electrolytic solution is easy to enter a groove. Accordingly, diffusion of reactants and products becomes faster, and reactivity improves compared to a part where the width of the void is narrow. Accordingly, activity of the reduction catalyst layer where a lot of wide voids exist becomes higher even if a specific surface area is the same. If only the oxidation is performed, the diffusion of the reactants and the products becomes slow and the activity becomes low since the number of voids becomes small and the width of the void is narrow.

When the sample of the porous catalyst layer prepared by the above-stated method is used for a reduction reaction of carbon dioxide, the sample is preferably immersed in an electrolytic solution where carbon dioxide is sufficiently injected into a 0.25 M sodium carbonate aqueous solution, and it is left until air bubbles are not generate from a surface after the high-frequency potential is applied before the reaction, though it is not particularly limited. After that, electrochemical reduction is performed by applying the potential of −0.4 V (vs RHE) to the porous catalyst layer under a bubbling condition of carbon dioxide by using an electrolytic solution where carbon dioxide is sufficiently injected into the sodium carbonate aqueous solution. As the electrolytic solution used at this time, there may be used an electrolytic solution such as a 0.5 M sulfuric acid, or the like.

Figure 22:
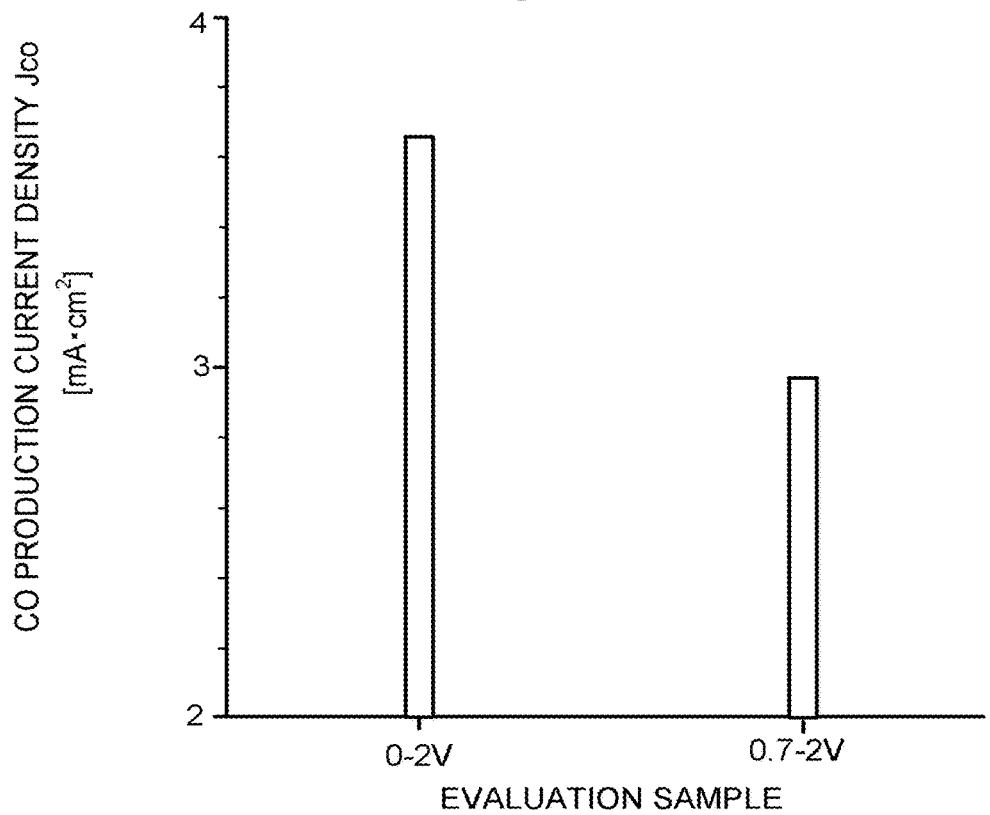
FIG. 22 is a view illustrating a current density consumed for production of carbon monoxide in a reduction reaction test by each evaluation sample.

FIG. 22 is a view illustrating a current density consumed for production of carbon monoxide in the reduction reaction test by each evaluation sample. As illustrated in FIG. 22, it can be seen that the porous catalyst layer formed by applying the high frequency of the above-stated 0-2 V (vs Hg/HgSO$_4$: 0.5 M, H$_2$SO$_4$ aqueous solution) shows excellent reactivity since the current density thereof increases than that of the porous catalyst layer formed by applying the above-stated high frequency of the 0.7-2 V (vs Hg/HgSO$_4$: 0.5 M, H$_2$SO$_4$ aqueous solution).

The porous catalyst layer prepared by the above-stated method is not necessarily used from an electrochemically reduced state, but it may be used under an oxidized state. In this case, an electrochemically reduction process is included, and therefore, a manufacturing process can be shortened.

The porous catalyst layer prepared by the above-stated method can be used as, for example, the electrode layer 13c containing both the conductive material and the reduction catalyst illustrated in FIG. 5.

Figure 23:
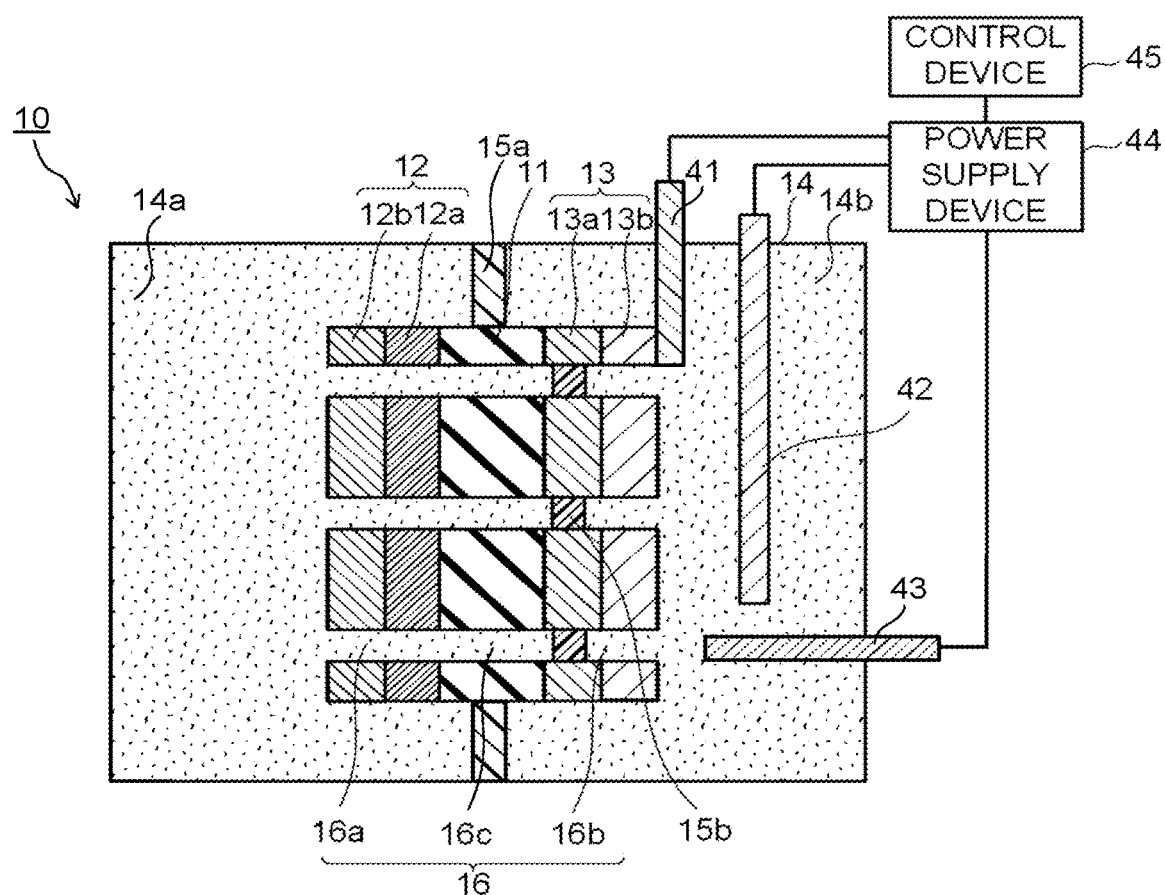
FIG. 23 is a schematic view illustrating another structure example of the electrochemical reaction device.

The electrochemical reaction device 10 illustrated in FIG. 23 is at least different at least in a point that it is possible to recover (reproduce) the selectivity of the carbon compounds which are produced by the reduction reaction of $CO_2$ by the reduction electrode 13 by the application of the potential for the reduction electrode 13 compared to the electrochemical reaction device 10 illustrated in FIG. 1.

The electrochemical reaction device 10 illustrated in FIG. 23 includes a conductive layer 41 which is connected to the reduction electrode 13, an auxiliary electrode 42 which is immersed in the second region 14b, a reference electrode 43 which is immersed in the second region 14b, a power supply device 44 which is connected to the reduction electrode 13, the auxiliary electrode 42 and the reference electrode 43, and a control device 45 which is connected to the power supply device 44 in addition to the structure illustrated in FIG. 1.

The conductive layer 41 has a function as a part of a working electrode when the potential is applied to the reduction electrode 13. Namely, the reduction electrode 13 and the conductive layer 41 can be regarded as the working electrodes. Examples of the conductive layer 41 include a layer of a material such as platinum, gold, silver, copper, an alloy such as SUS, and carbon. The conductive layer 41 is not necessarily in contact with the reduction catalyst layer 13b, but may be in contact with the conductive layer 13a. When the electrode layer 13c, the porous conductive layer 13d, the porous catalyst layer 13e and so on are provided as the reduction electrode 13, the conductive layer 41 may be in contact with any of the electrode layer 13c, the porous conductive layer 13d, and the porous catalyst layer 13e.

The auxiliary conductive layer 42 has a function as a counter electrode when the potential is applied to the reduction electrode 13. Examples of the auxiliary conductive layer 42 include a layer of a material having conductivity such as platinum, gold, silver, copper, an alloy such as SUS, and carbon. As the auxiliary electrode 42, a material where the auxiliary electrode 42 in itself is melted may be used. All of the auxiliary electrode 42 may be melted by the application of the potential to be exhausted. When the selectivity of the carbon compounds is intermittently recovered (reproduced) at the electrochemical reaction device 10, it is preferable that the auxiliary electrode 42 has a reproducible or replenishable material, or a system capable of reproducing or replenishing the auxiliary electrode 42 is held to proceed the reaction.

The reference electrode 43 is an electrode having a function as a reference electrode when the potential is applied to the reduction electrode 13. Examples of the reference electrode 43 include silver-silver chloride.

Figure 24:
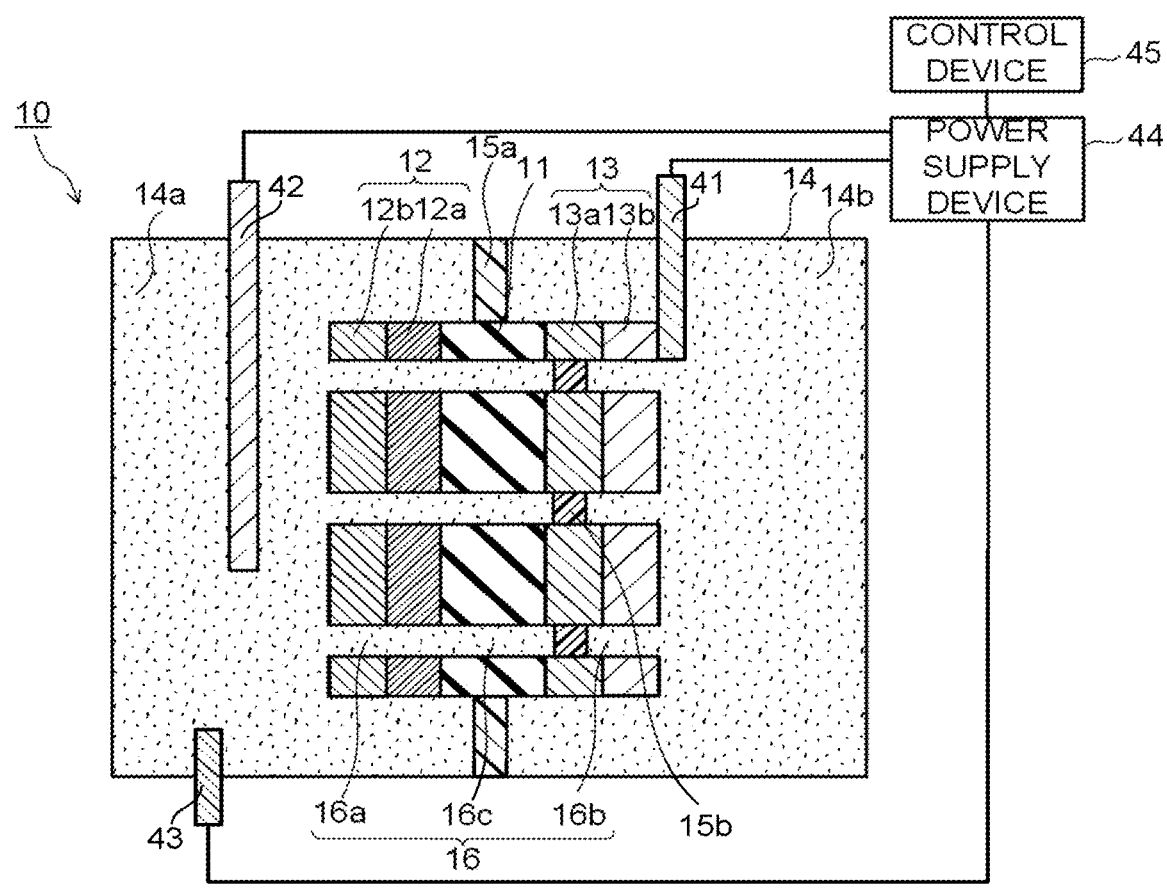
FIG. 24 is a schematic view illustrating another structure example of the electrochemical reaction device.
Figure 25:
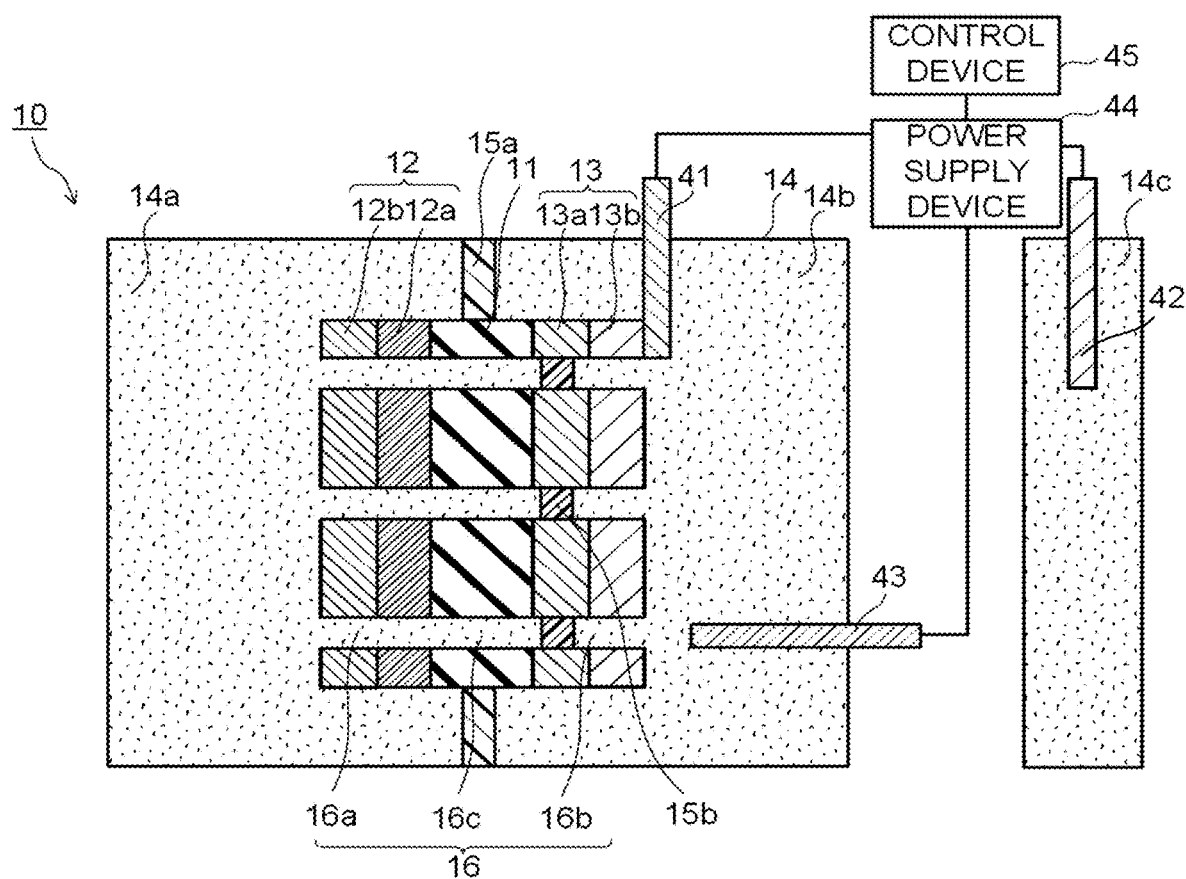
FIG. 25 is a schematic view illustrating the other structure example of the electrochemical reaction device.

The auxiliary electrode 42 and the reference electrode 43 may be immersed in the first region 14a as illustrated in FIG. 24. A membrane, a salt bridge and so on to divide each region may be provided between the auxiliary electrode 42 and the first region 14a or the second region 14b, or between the reference electrode 43 and the first region 14a or the second region 14b. Further, an electrolytic solution to be a third region 14c where the auxiliary electrode 42 is immersed may be provided as illustrated in FIG. 25. The electrolytic solution to be the third region 14c is stored in, for example, a container such as an electrolytic tank which is different from the electrolytic solution to be the first region 14a and the second region 14b. Structures illustrated in FIG. 23 to FIG. 25 may be provided together with other measuring devices such as a pH meter, and are applicable when there is a through hole.

All of the conductive layer 41, the auxiliary electrode 42, and the reference electrode 43 may be immersed in the electrolytic solution 14, and connected to the external power supply device 44 by wirings. The conductive layer 41, the auxiliary electrode 42, and the reference electrode 43 may be provided at the electrochemical reaction device 10 only when, for example, the potential is applied to the reduction electrode 13 to recover (reproduce) the selectivity of the carbon compounds. In this case, it can be regarded as an electrochemical reaction system including the electrochemical reaction device 10 and a reduction electrode recovery (reproduction) device (reduction electrode cleaning device) including the conductive layer 41, the auxiliary electrode 42, the reference electrode 43, the power supply device 44, and the control device 45.

The power supply device 44 is provided, for example, outside the electrolytic solution 14. The power supply device 44 is connected to the conductive layer 41, the auxiliary electrode 42, and the reference electrode 43 through, for example, wirings. The power supply device 44 has a function of applying the potential to the reduction electrode 13. The power supply device 44 is provided, for example, outside the electrolytic solution 14. The power supply device 44 includes, for example, a power supply circuit, and a control circuit controlling the power supply circuit. The control circuit has, for example, a CPU (central processing unit), a memory, a logical circuit, and so on, and generates and outputs control signals to be input to the power supply circuit.

The power supply device 44 may have electrochemical measuring functions such as an impedance measurement, a constant voltage current measurement, a constant current voltage measurement by including, for example, an electrochemical measurement device. In addition, measuring functions other than the electrochemical measurement such as a temperature measurement and a pH measurement may be held by including sensors such as a temperature sensor and a pH sensor.

The control device 45 is provided, for example, outside the electrolytic solution 14. The control device 45 has a function of controlling applying conditions of the potential by the power supply device 44. The control device 45 has, for example, a CPU (central processing unit), a memory, a logical circuit, and so on, and generates and outputs control signals to be input to the power supply device 44.

For example, a current passing through the reduction electrode 13 at the reduction reaction time is monitored by a sensor or the like, and the potential of the control signal is controlled in accordance with the current value, to thereby control necessity of the potential apply by the power supply device 44 and a value of the potential to be applied. The control device 45 may have a function of controlling measurements which can be performed by the power supply device 44. Other control functions such as, for example, a gas component composition analysis, a solution component composition analysis, and so on may be held without being limited to the above.

Next, a recovery (reproduction) method of the selectivity of CO by a $CO_2$ reduction reaction using the electrochemical reaction device 10 illustrated in FIG. 23 is described.

According to the above-stated recovery (reproduction) method, the potential higher than the oxidation potential of the reduction electrode 13 (reduction catalyst layer 13b) and the potential lower than the reduction potential of the reduction electrode 13 (reduction catalyst layer 13b) are applied to the reduction electrode 13. For example, the potential higher than the oxidation potential of the reduction catalyst layer 13b and the potential lower than the reduction potential of the reduction catalyst layer 13b are separately applied between the reduction electrode 13 and the auxiliary electrode 42, or an alternating current potential having a maximum potential higher than the oxidation potential of the reduction catalyst layer 13b and a minimum potential lower than the reduction potential of the reduction catalyst layer 13b is applied between the reduction electrode 13 and the auxiliary electrode 42.

The oxidation potential of the reduction catalyst layer 13b is a potential capable of shifting a valence of a metal from zero-valence to a positive valence when the reduction catalyst layer 13b is the metal. When the reduction catalyst layer 13b is oxide or the like, and already has the positive valence, it is the potential capable of shifting the valence to a further positive valence than the value.

The reduction potential of the reduction catalyst layer 13b is a potential capable of shifting a valence of a metal from the positive valence to zero-valence when the reduction catalyst layer 13b is the metal. When the reduction catalyst layer 13b is oxide or the like, and already has the positive valence, it is the potential capable of returning the valence to the value.

The application of the potential is performed when, for example, the selectivity of CO and the current value at the production time are lowered and so on, and thereby, the reduction catalyst layer 13b is cleaned, and the CO selectivity and the current value at the production time can be recovered (reproduced). At this time, the electrolytic solution may be changed to one suitable for the cleaning of the catalyst layer.

When the potential is applied, it is preferable to respectively apply the oxidation potential and the reduction potential once or more. It is preferable that the application of the potential is repeated until the change of the current value during the reaction becomes approximately constant. At this time, it is preferable that the measurement of the current value flowing between the electrodes is possible.

When the electrochemical reaction device 10 is used, it is preferable to perform the application and sweep of the potential once or more before usage. It is preferable to use a device capable of analyzing or monitoring a composition of products by the reduction reaction or the current value during the reaction. It is thereby possible to automatically perform the application of the potential in accordance with the composition of the products and the current value during the reaction.

For example, when the CO production selection rate is 80% or less among the products by the reduction reaction, or when the current value during the reaction is a half or less of the current value obtained at a beginning of the reaction, it is preferable to perform the application operation of the potential at least once or more. The application operation of the potential is preferably performed by a system where an algorithm indicating the application operation of the above-stated potential is installed being interlocked with the electrochemical reaction device 10.

Table 1 is a view illustrating a relationship between a $CO_2$ reduction reaction and a CO production selection rate at an evaluation sample. In an experiment to obtain results in Table 1, for example, the potential of −0.4 V (vs RHE) is applied to the reduction electrode in the electrolytic solution, and an average value of the production selectivities of carbon monoxide being the reduction product which is produced during one hour after the reaction is calculated as for an evaluation sample where a gold nanoparticle electrode is used as the reduction electrode, and a $CO_2$ saturated sodium hydrogen carbonate aqueous solution is used as the electrolytic solution. After that, the reduction electrode after usage is cleaned with pure water, spontaneously dried, and the average value of the CO production selectivities is repeatedly calculated.

TABLE 1

| Number Of Times | CO Production Selection Rate |
| --- | --- |
| First | 94% |
| Second | 82% |
| Third | 82% |
| Fourth | 77% |
| First(After Application Operation) | 98% |
| Second (After Application Operation) | 96% |

In Table 1, the CO production selection rate is lowered to less than 80% in a fourth $CO_2$ reduction reaction. Then an operation applying a potential to the working electrode while sweeping in a range from −1.3 to +1.4 V (vs Ag/AgCl) at 150 mV/sec is repeated 100 times for an evaluation sample where the gold nanoparticle electrode is used as the working electrode, a platinum electrode is used as the counter electrode, and a silver-silver chloride electrode is used as the reference electrode, and the $CO_2$ saturated sodium hydrogen carbonate aqueous solution is used as the electrolytic solution. For example, the potential is swept and applied from "0" (zero) V to −1.3 V in a first application operation of the potential, and thereafter, the potential is swept and applied from −1.3 V to 1.4 V, and then, the potential is swept and applied from 1.4 V to "0" (zero) V.

Figure 26:
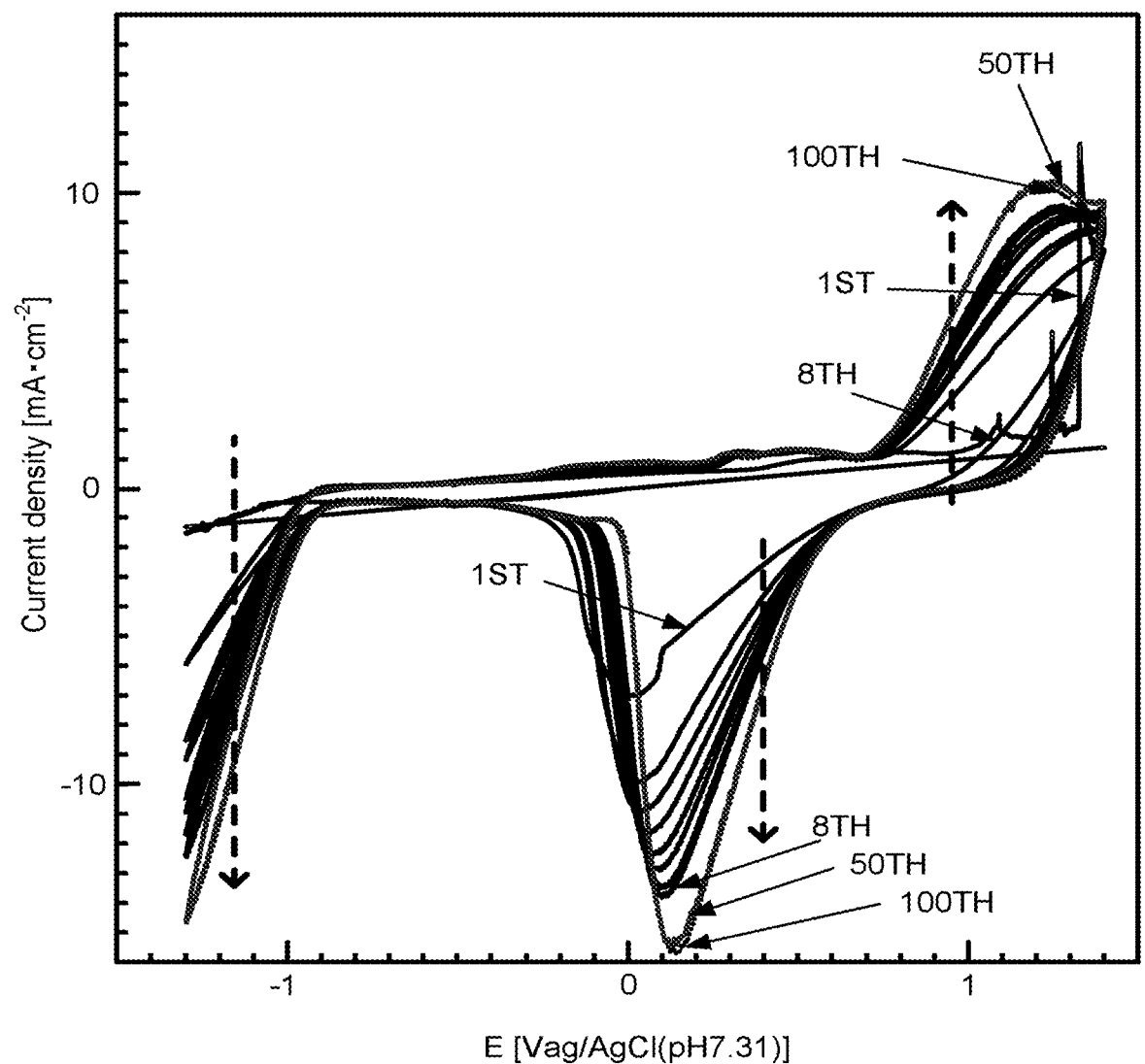
FIG. 26 is a view illustrating a relationship between an applied potential and a current density in an apply operation of potential.

FIG. 26 is a view illustrating a relationship between an applied potential and a current density in the application operation of the potential. A horizontal axis represents the applied potential, and a vertical axis represents the generated current density. As illustrated in FIG. 26, it can be seen that noise is contained in a first application of the potential, though the current densities obtained at respective potentials increase both in positive and negative by repeating the application operation of the potential, and there is seldom difference between at a 50th application (solid line) and at a 100th application (dotted line). After that, the potential of −0.4 V (vs RHE) is applied to the working electrode under the same conditions, and the reduction reaction by $CO_2$ is performed, then it can be seen that the CO production selection rate is recovered as illustrated in Table 1 (first time (after the application operation)). After that, the potential is applied to the working electrode while sweeping from −1.3 V to +1.4 V (vs RHE) under the same conditions, and thereafter, the potential of −0.4 V (vs RHE) is applied to the working electrode, then it can be seen that the CO production selection rate is seldom lowered as illustrated in Table 1 (second time (after the application operation)).

Figure 8:
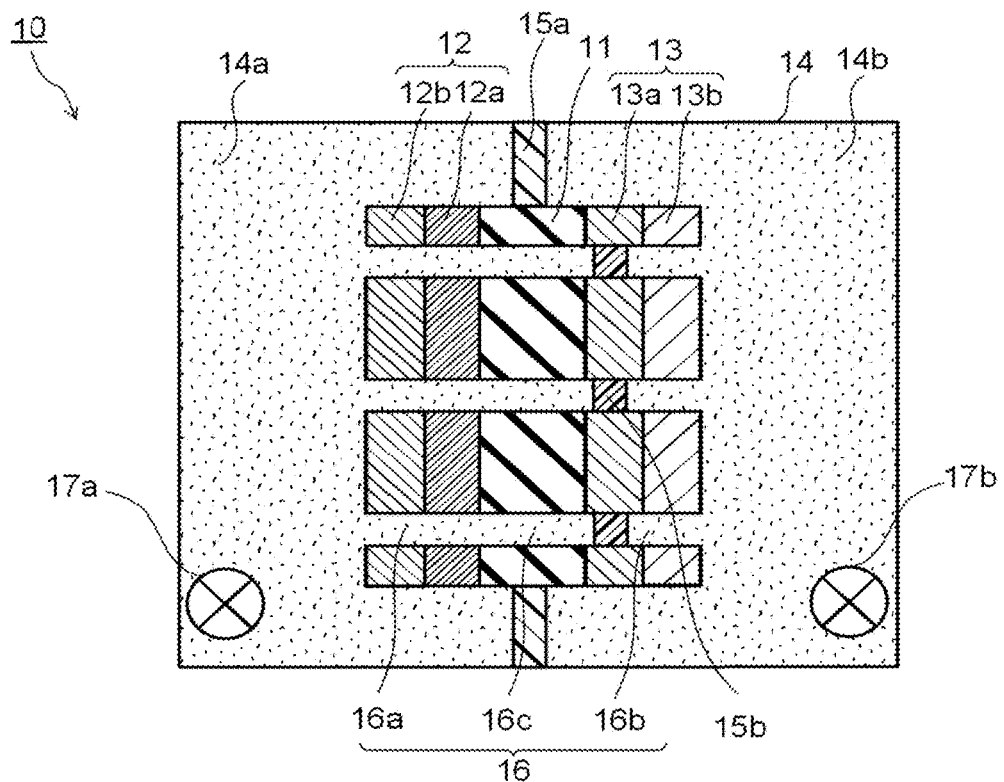
FIG. 8 is a schematic view illustrating another structure example of the electrochemical reaction device.

The electrochemical reaction device 10 illustrated in FIG. 8 includes a stirrer 17a and a stirrer 17b in addition to the components of the electrochemical reaction device 10 illustrated in FIG. 1. The stirrer 17a is provided at the first region 14a, and the stirrer 17b is provided at the second region 14b.

The pH value of the second region 14b is preferably lower than the pH value of the first region 14a. However, there is a case when a pH value at a surface and a pH value at an inside are different in each of the oxidation electrode 12 and the reduction electrode 13. In this case, the pH value changes by the oxidation-reduction reaction, and thereby, there is a case when a pH distribution where, for example, the pH value at the surface of the reduction electrode 13 is higher than the pH value at the surface of the oxidation electrode 12 is formed.

On the other hand, in the electrochemical reaction device 10 illustrated in FIG. 8, it is possible to increase uniformity of each pH value by stirring the first region 14a and the second region 14b with the stirrer 17a and the stirrer 17b. It is possible to lower resistance between the first region 14a and the second region 14b by accelerating movement of ions, and therefore, conversion efficiency can be increased.

Figure 9:
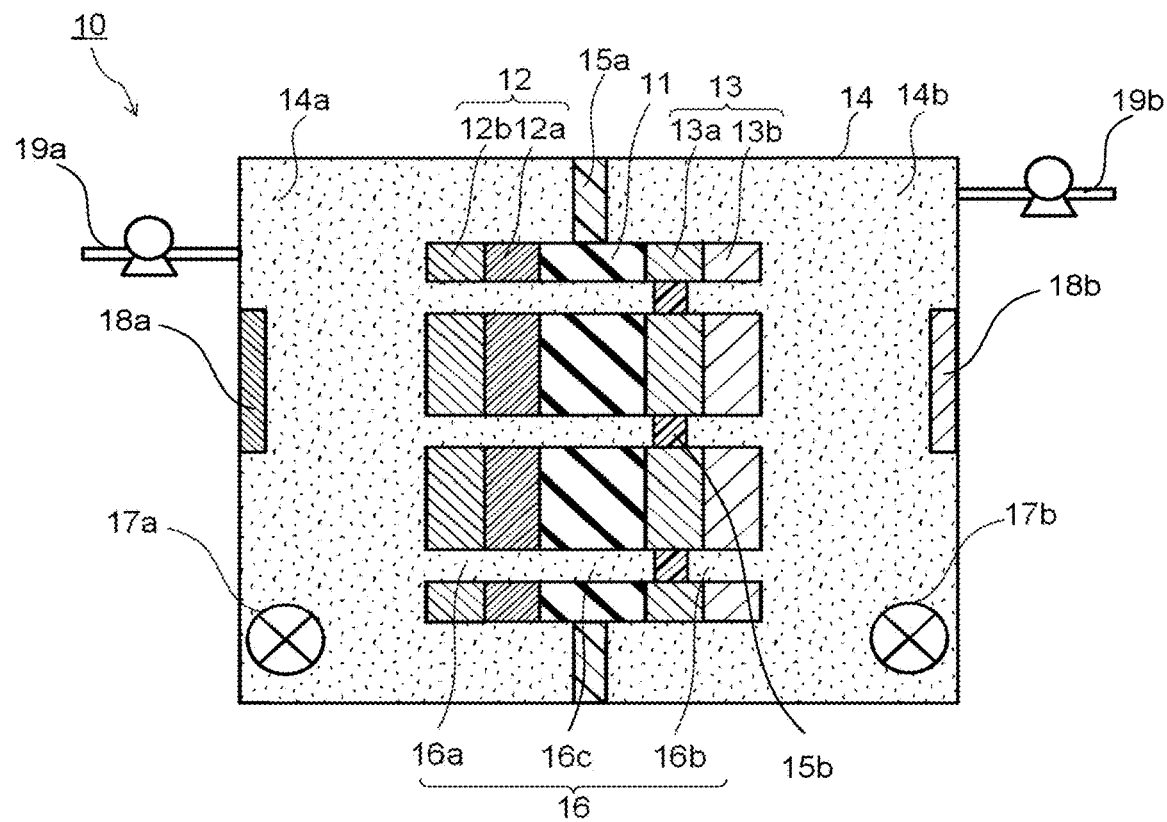
FIG. 9 is a schematic view illustrating another structure example of the electrochemical reaction device.

The electrochemical reaction device 10 illustrated in FIG. 9 includes the stirrer 17a and the stirrer 17b, a pH sensor 18a and a pH sensor 18b, and a supply flow path 19a and a supply flow path 19b in addition to the components of the electrochemical reaction device 10 illustrated in FIG. 1. Each of the pH sensor 18a and the pH sensor 18b has a measurement electrode. The measurement electrode of the pH sensor 18a is in contact with the first region 14a, and the measurement electrode of the pH sensor 18b is in contact with the second region 14b.

A pH value of the electrolytic solution 14 is measured by the pH sensors 18a, 18b. A reduction catalyst is used for the measurement electrode of the pH sensor 18b, and a reduction reaction may be generated at the measurement electrode to produce the carbon compounds. The carbon compounds may be produced by using light energy by electrically connecting the oxidation electrode 12 or the reduction electrode 13 with the pH sensor measurement electrode. The energy is not limited to the light energy, but may be an external power supply or other natural energies. In this case, a carbon compound different from the carbon compound produced at the reduction electrode 13 may be produced. For example, carbon monoxide is produced by the reduction electrode 13, and formic acid may be produced by the measurement electrode of the pH sensor 18b. The measurement electrode of the pH sensor 18b may be connected to an external power supply to be used as a second reduction electrode, and for example, there may be performed a two-step reduction where formic acid or the like produced by the reduction reaction of the reduction electrode 13 being a first reduction electrode is further reduced to produce methanol or the like by the second reduction electrode. A position of the measurement electrode of the pH sensor 18b is arbitrary, and for example, it may be provided in a vicinity of the oxidation electrode 12. The measurement electrode of the pH sensor 18a may be used for the oxidation reaction.

The supply flow path 19a has a function of supplying the reactant when the pH value of the electrolytic solution 14 measured by the pH sensor 18a is out of a reference range, and the supply flow path 19b has a function of supplying the reactant when the pH value of the electrolytic solution 14 measured by the pH sensor 18b is out of the reference range. For example, a valve may be provided at each of the supply flow paths 19a, 19b, and the valve may be controlled by a control circuit having an arithmetic circuit such as a CPU to open the valve when the measurement value of the pH sensor is out of the reference range. An electrolytic solution containing the reactant may be supplied through the supply flow path 19a and the supply flow path 19b.

Figure 10:
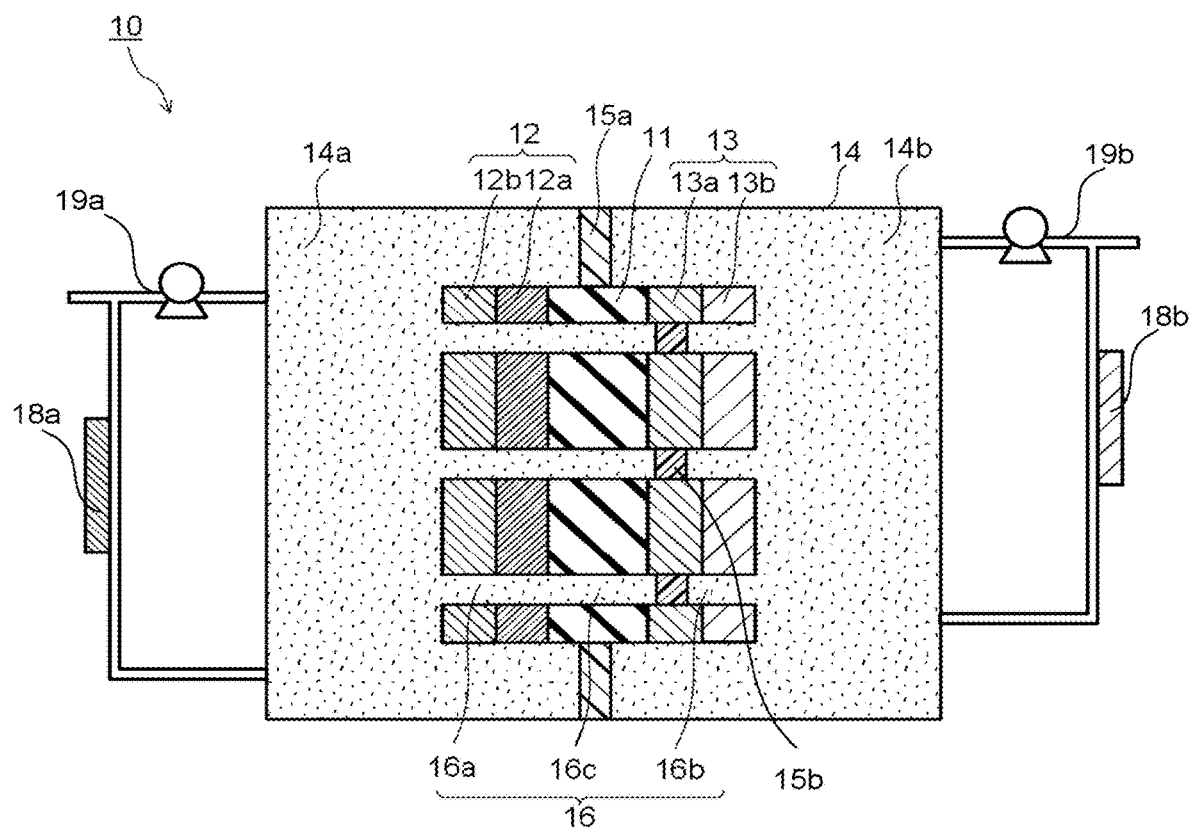
FIG. 10 is a schematic view illustrating another structure example of the electrochemical reaction device.

The electrochemical reaction device 10 illustrated in FIG. 10 includes the pH sensor 18a and the pH sensor 18b, and the supply flow path 19a and the supply flow path 19b in addition to the components of the electrochemical reaction device 10 illustrated in FIG. 1, where the supply flow path 19a is in contact with the first region 14a of the electrolytic solution 14 at two points or more, and the supply flow path 19b is in contact with the second region 14b of the electrolytic solution 14 at two points or more. In this case, as illustrated in FIG. 10, the pH sensor 18a may be provided to be in contact with the supply flow path 19a, and the pH sensor 18b may be provided to be in contact with the supply flow path 19b. The stirrers may be provided in FIG. 10 as same as in FIG. 9.

Each of the supply flow path 19a and the supply flow path 19b is in contact with the electrolytic solution 14 at two points or more, and thereby, it is possible to circulate the electrolytic solution 14 by the supply flow path 19a and the supply flow path 19b. If a temperature distribution is supplied to the electrolytic solution 14 by the sunlight or the like, it is preferable since the circulation occurs by natural convection. Accordingly, it becomes easy to uniformize not only the pH value but also a temperature, a concentration, and so on in the electrolytic solution 14. In this case, the stirrers are not necessary to be provided, and therefore, energy in accordance with stirring decreases, and the system can be simplified. The electrolytic solution 14 may be circulated by using a circulating pump. When a plurality of containers each storing the electrolytic solution 14 are arranged to simplify a circulation channel, it becomes possible to prepare a whole of the electrolytic solution 14 at once. Further, the reactant may be supplied by being contained in the electrolytic solution or the like through the supply flow path 19a and the supply flow path 19b in accordance with the measurement values of the pH sensors 18a, 18b as same as in FIG. 9.

Ions may be more effectively circulated by generating a temperature difference in the electrolytic solution by using heat which is increased due to irradiation of light on the photovoltaic body 11. In other words, it is possible to accelerate the moving of ions by the convection other than the ion diffusion. On the other hand, a temperature adjuster which adjusts the temperature of the electrolytic solution may be provided in the container storing the electrolytic solution 14 or in an electrolytic solution supply flow path, and then the oxidation-reduction reaction can be controlled by a temperature control.

Parts of the electrochemical reaction devices 10 illustrated in FIG. 1, FIG. 4 to FIG. 6, FIG. 8 to FIG. 10, and FIG. 23 to FIG. 25 are able to be appropriately substituted with each other. At least parts of the electrochemical reaction devices 10 illustrated in FIG. 1, FIG. 4 to FIG. 6, FIG. 8 to FIG. 10, and FIG. 23 to FIG. 25 are able to be combined with each other.

It should be noted that the embodiments have been presented by way of example only, and are not intended to limit the scope of the inventions. These embodiments may be embodied in a variety of other forms, and various omissions, substitutions and changes may be made without departing from the spirit of the inventions. These embodiments and modifications thereof are included in the scope and spirit of the inventions and included in the inventions described in the claims and their equivalents.

Examples

Figure 27:
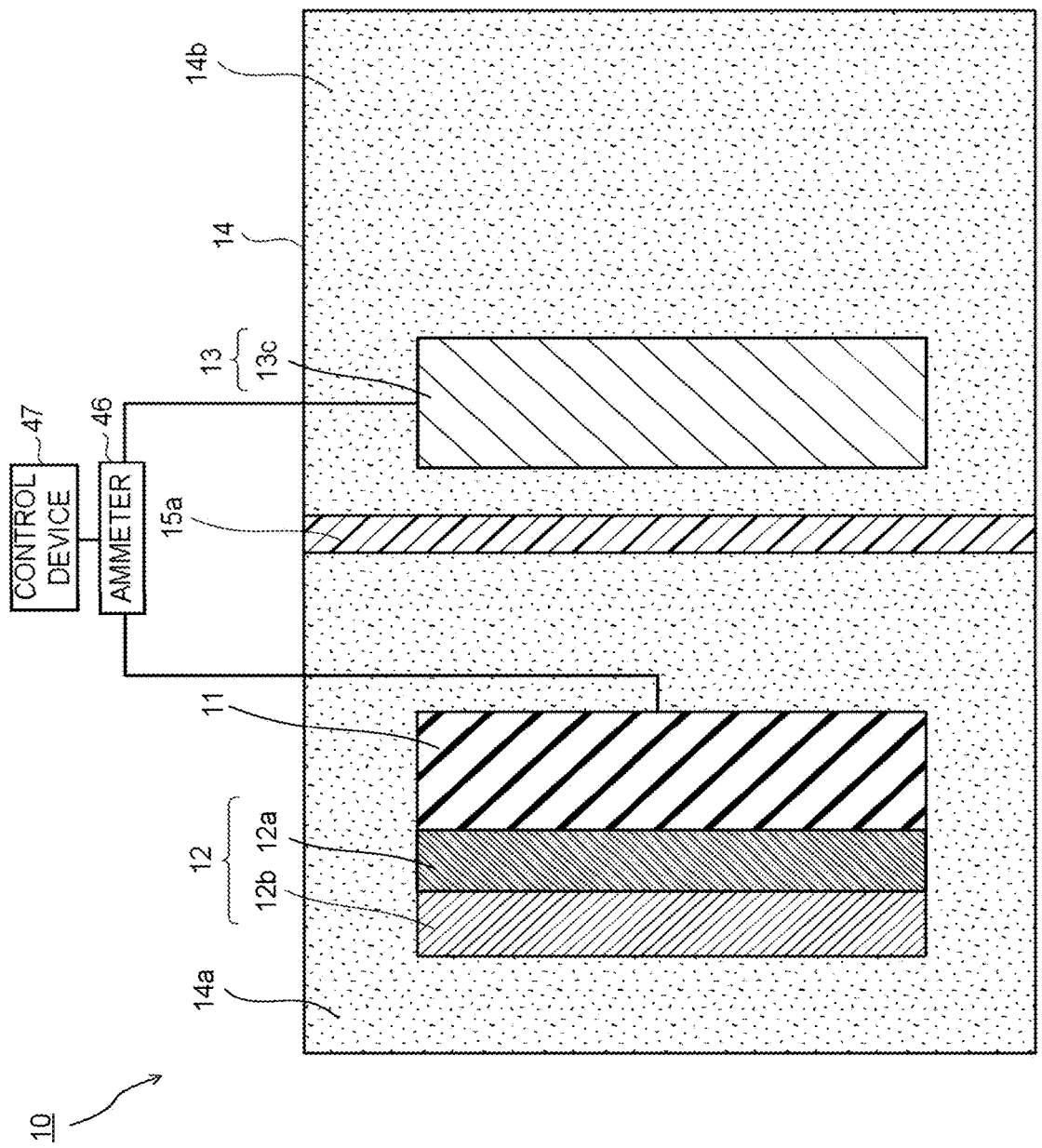
FIG. 27 is a schematic view illustrating a structure of an electrochemical reaction device of an example.

FIG. 27 is a view illustrating a structure of an electrochemical reaction device according to the example. The electrochemical reaction device 10 illustrated in FIG. 27 is different in points that the through hole 16 and the ion exchange membrane 15b are not provided, the photovoltaic body 11 is immersed in the first region 14a, the electrode layer 13c having the reduction catalyst function illustrated in FIG. 5 is included as the reduction electrode 13, the ion exchange membrane 15a is included between the first region 14a and the second region 14b, and the second face of the photovoltaic body 11 and the reduction electrode 13 are connected by wiring or the like compared to the electrochemical reaction device 10 illustrated in FIG. 1. In this case, the electrochemical reaction device 10 includes an ammeter 46 between the second face of the photovoltaic body 11 and the reduction electrode 13. The electrochemical reaction device 10 includes a control device 47 which is connected to the ammeter 46. The control device 47 may be provided outside the electrochemical reaction device 10.

The ammeter 46 has a function of measuring the current passing through the reduction electrode 13. The control device 47 has a function of controlling, for example, measurement conditions by the ammeter 46. The control device 47 has, for example, a CPU, a memory, a logic circuit, and so on, and generates and outputs control signals input to the ammeter 46.

At a light irradiation time (operation period of the electrochemical reaction device 10), it is possible to measure the current value by the ammeter 46, and transmit the obtained current value data to the control device 47 in real-time. The control device 47 may have functions of interrupting the operation of the electrochemical reaction device 10 and transferring to a process, or the like when the transmitted current value data is below a value to be a reference. Namely, the control device 47 may have the function as the control device 45. A plurality of electrochemical reaction devices 10 may be controlled by the control device 47.

A three junction type (pin junction type) photovoltaic body with 1 cm in length×1 cm in width×500 nm in thickness was used as the photovoltaic body 11. An oxidation electrode having the conductive layer 12a made up of an ITO layer with a thickness of 70 nm and the oxidation catalyst layer 12b made up of a cobalt oxide layer with a thickness of 15 nm was used as the oxidation electrode 12 on the photovoltaic body 11.

A reduction electrode made up of the electrode layer 13c containing gold as the conductive material and containing the porous gold catalyst as the reduction catalyst with 1 cm in length×1 cm in width×1 mm in thickness was used as the reduction electrode 13. A Selemion (registered trademark) film was used as the ion exchange membrane 15a. A 0.5 M potassium borate aqueous solution, a 0.25 M sodium carbonate aqueous solution where carbon dioxide was sufficiently injected, or a 0.25 M sodium carbonate aqueous solution where carbon dioxide was not injected was used as the electrolytic solution at the first region 14a where the photovoltaic body 11 and the oxidation electrode 12 were immersed. The 0.25 M sodium carbonate aqueous solution where carbon dioxide was sufficiently injected was used as the electrolytic solution at the second region 14b where the reduction electrode 13 is immersed.

There was calculated conversion efficiency from the light to carbon monoxide when the $CO_2$ reduction reaction was performed by irradiating light of 1 SUN (1000 W/m$^2$) on a light-receiving surface (first face) of the photovoltaic body 11 for one hour. The conversion efficiency was calculated by the following expression (3).

$$\eta = [R(CO) \times \Delta G^0]/[P \times S] \times 100 \quad (3)$$

(In the expression (3), represents the conversion efficiency (%) from the light to carbon monoxide, R(CO) represents a carbon monoxide production speed (mol/sec), $\Delta G^0$ represents a standard Gibbs free energy variation (257.2 kJ/mol) obtained when carbon monoxide burns, P represents an energy intensity (1000 W/m$^2$) of irradiation light, and S represents a light receiving area (cm$^2$) of the irradiation light.)

Table 2 is a table illustrating conversion efficiency from the light to carbon monoxide when the $CO_2$ reduction reactions were performed. As illustrated in Table 2, the conversion efficiency from the light to carbon monoxide when the 0.5 M potassium borate aqueous solution was used as the electrolytic solution at the first region 14a was approximately 1.5%. The conversion efficiency from the light to carbon monoxide when the 0.25 M sodium carbonate aqueous solution where carbon dioxide was sufficiently injected was used as the electrolytic solution at the first region 14a was approximately 0.5%. Further, the conversion efficiency from the light to carbon monoxide when the 0.25 M sodium carbonate aqueous solution where carbon dioxide was not injected was used as the electrolytic solution at the first region 14a was approximately 1.1%.

TABLE 2

| FIRST REGION 14a (OXIDATION SIDE) | SECOND REGION 14b (REDUCTION SIDE) | CONVERSION EFFICIENCY |
|---|---|---|
| 0.5M Potassium Borate Aqueous Solution | 0.25M Sodium Carbonate Aqueous Solution (with $CO_2$ Injection) | 1.5% |
| 0.25M Sodium Carbonate Aqueous Solution (with $CO_2$ Injection) | 0.25M Sodium Carbonate Aqueous Solution (with $CO_2$ Injection) | 0.5% |
| 0.25M Sodium Carbonate Aqueous Solution (without $CO_2$ Injection) | 0.25M Sodium Carbonate Aqueous Solution (with $CO_2$ Injection) | 1.1% |

As illustrated in Table 2, the conversion efficiency from the light to carbon monoxide when the 0.25 M sodium carbonate aqueous solution where carbon dioxide was not injected was used as the electrolytic solution at the first region 14a was higher than the conversion efficiency from the light to carbon monoxide when the 0.25 M sodium carbonate aqueous solution where carbon dioxide was sufficiently injected was used as the electrolytic solution at the first region 14a. It is conceivable that this is because a liquid junction potential is generated between the electrolytic solution at the first region 14a and the electrolytic solution at the second region 14b since carbon dioxide is sufficiently injected into only the electrolytic solution at the second region 14b and the pH value of the electrolytic solution at the second region 14b is lowered. It is conceivable that the pH value of the electrolytic solution at the first region 14a is not lowered, and thereby, overpotential at the oxidation reaction time by the oxidation electrode 12 is suppressed.

The electrochemical reaction device of the example improve the conversion efficiency by injecting $CO_2$ even though, for example, the electrolytic solution is not prepared, and therefore, it is possible to permanently proceed a cycle of the oxidation-reduction reaction.

What is claimed is:

1. An electrochemical reaction device, comprising:
   an electrolytic solution tank;
   an oxidation electrode disposed in the electrolytic solution tank;
   a reduction electrode disposed in the electrolytic solution tank; and a generator connected to the oxidation electrode and the reduction electrode, wherein the reduction electrode has
- a carbon porous layer having a porous structure with a pore distribution of 5 μm or more and 10 μm or less, and
- a metal porous layer disposed on the carbon porous layer, the metal porous layer having a porous structure with a pore distribution of 5 nm or more and 100 nm or less and containing particles of a reduction catalyst of 100 nm or less, the reduction catalyst being at least one selected from the group consisting of Au, Ag, Cu, Pt, Ni, Zn and Pd, wherein the generator has a photovoltaic body having a first face connected to the oxidation electrode and a second face connected to the reduction electrode, and is configured to perform charge separation by energy of light irradiated on the first face or the second face, wherein the oxidation electrode is in contact with the first face of the photovoltaic body, and has a first through hole which is capable of passing an electrolytic solution through, wherein the reduction electrode is in contact with the second face of the photovoltaic body, and has a second through hole which is capable of passing the electrolytic solution through, and wherein the photovoltaic body has a third through hole which is capable of passing the electrolytic solution through and communicated with the first through hole and the second through hole.

2. The device of claim 1, wherein the particles of the reduction catalyst have a particle size of 5 nm or less for 25% or more of a total number of particles.

3. The device of claim 1, wherein the metal porous layer has three pieces or more of voids each having a width of 300 nm or more in a range of 40 micrometers in width, or five pieces or more of voids each having a width of 100 nm or more in the range of 40 micrometers in width.

4. The device of claim 3, wherein the metal porous layer is formed by applying a high frequency having a minimum potential of a reduction potential of the metal porous layer or less and a maximum potential of an oxidation potential of the metal porous layer or more.

5. The device of claim 1, wherein the reduction electrode contains a surface active agent.

6. The device of claim 5, wherein the surface active agent has polyvinylpyrrolidone or polyvinyl alcohol.

7. The reaction device of claim 1, wherein the reduction electrode has an ion exchange resin.

8. The device of claim 1, further comprising:
an ion exchange membrane provided to block at least one of the first through hole to the third through hole to allow permeation of a part of ions contained in the electrolytic solution.

9. The device of claim 1, further comprising:
a stirrer disposed in the electrolytic solution tank;
a pH sensor disposed in the electrolytic solution tank and configured to measure a pH value of an electrolytic solution; and
a supply flow path connected to with the electrolytic solution tank,
wherein a reactant for adjusting the pH value of the electrolytic solution is supplied to the electrolytic solution tank through the supply flow path when the pH value of the electrolytic solution measured by the pH sensor is out of a reference range.

10. The device of claim 1, wherein the reduction catalyst is at least one selected from the group consisting of Au, Ag, Pt, Ni, Zn, and Pd.

* * * * *